United States Patent
Tai et al.

(10) Patent No.: US 11,190,722 B2
(45) Date of Patent: Nov. 30, 2021

(54) IMAGE SENSOR, SIGNAL ACQUISITION METHOD AND CIRCUIT OF IMAGE SENSOR, STORAGE MEDIUM AND TERMINAL

(71) Applicant: Shanghai Harvest Intelligence Technology Co., Ltd., Shanghai (CN)

(72) Inventors: Ya-Hsiang Tai, Shanghai (CN); Ping-Ju Huang, Shanghai (CN)

(73) Assignee: Shanghai Harvest Intelligence Technology Co., Ltd., Shanghai (CN)

( * ) Notice: Subject to any disclaimer, the term of this patent is extended or adjusted under 35 U.S.C. 154(b) by 23 days.

(21) Appl. No.: 16/869,234

(22) Filed: May 7, 2020

(65) Prior Publication Data
US 2020/0358974 A1  Nov. 12, 2020

(30) Foreign Application Priority Data
May 8, 2019 (CN) .......................... 201910380238.4

(51) Int. Cl.
| | |
|---|---|
| *H01L 27/146* | (2006.01) |
| *H04N 5/374* | (2011.01) |
| *H04N 5/378* | (2011.01) |
| *H04N 5/3745* | (2011.01) |

(52) U.S. Cl.
CPC ......... *H04N 5/378* (2013.01); *H01L 27/1461* (2013.01); *H04N 5/3741* (2013.01); *H04N 5/37452* (2013.01)

(58) Field of Classification Search
CPC ................ H04N 5/3696; H04N 5/3694; H01L 27/14603
See application file for complete search history.

(56) References Cited

U.S. PATENT DOCUMENTS 7,876,974 B2 * 1/2011 Brajovic ................. G06T 5/002
382/264

* cited by examiner

*Primary Examiner* — Thanh Luu
(74) *Attorney, Agent, or Firm* — Harness, Dickey & Pierce, P.L.C.

(57) ABSTRACT

An image sensor, a signal acquisition method and a signal acquisition circuit of the image sensor, a storage medium and a terminal are provided. The image sensor includes a plurality of pixel modules, and each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection point between one pixel unit and the other pixel units is connected with a corresponding signal readout terminal; wherein two adjacent pixel modules share a same pixel unit and signal readout terminals connected with the first terminal and the second terminal of the same pixel unit.

19 Claims, 17 Drawing Sheets

IMAGE SENSOR, SIGNAL ACQUISITION METHOD AND CIRCUIT OF IMAGE SENSOR, STORAGE MEDIUM AND TERMINAL

CROSS-REFERENCE TO RELATED APPLICATIONS

This application claims the benefit of priority to Chinese patent application No. 201910380238.4, filed on May 8, 2019, the entire contents of which are incorporated herein by reference.

TECHNICAL FIELD

The present disclosure relates to the technical field of image sensors, in particular to an image sensor, a signal acquisition method and circuit, a storage medium, and a terminal.

BACKGROUND

Image sensors apply a photoelectric conversion function of a photosensitive element to convert a light image on a photosensitive surface into an electrical signal in a proportional relationship with the light image.

For example, an optical fingerprint sensor usually includes a pixel array, and each pixel in the pixel array has a photosensitive element to realize the conversion of a light signal to an electrical signal.

At present, the image sensors are continuously developing in the trend of large size, high resolution, high imaging quality and low cost. In addition, in recent years, the vigorous development of artificial intelligence has made the information obtained by image more important, which puts higher requirements on the resolution and imaging quality of the image sensors.

Existing image sensors usually work in collecting signals generated by all pixel units and transmitting the signals to an external reading system for reading and calculation.

However, such signal reading method often causes subtle signal loss, such as a differential mode signal, which in turn leads to an incompleteness of information collected by the image sensor.

The incompleteness of information will further cause a reduced efficiency of image capture and interpretation, as well as a loss of eigenvalues.

SUMMARY

Embodiments of the present disclosure provide an improved image sensor and an improved signal acquisition method and circuit of the image sensor, which can independently read a differential mode signal and a common mode signal in a single signal acquisition period, so as to effectively collect a complete signal of pixel units.

An embodiment of the present disclosure provides an image sensor. The image sensor includes a plurality of pixel modules, and each pixel module includes: n pixel units connected in series to form a closed-loop structure, wherein each pixel unit has a first terminal and a second terminal, and each pixel unit includes a photosensitive element and a pixel switch connected in series; and n signal readout terminals, wherein each serial connection point between one pixel unit and the other pixel unit is connected with a corresponding signal readout terminal; wherein two adjacent pixel modules share a same pixel unit and signal readout terminals connected with the first terminal and the second terminal of the same pixel unit.

In some embodiments, the image sensor further includes: a plurality of control lines, connected with control terminals of different pixel switches in a same pixel module respectively; a plurality of data lines, connected with signal readout terminals correspondingly; and a plurality of scanning lines, connected with photosensitive elements correspondingly.

In some embodiments, some of the pixel modules share a scanning line, some of the pixel modules share a data line, and some of the pixel modules share a control line.

In some embodiments, the plurality of pixel modules are formed on a glass substrate.

Another embodiment of the present disclosure provides a signal acquisition method of an image sensor. The image sensor includes a plurality of pixel modules, and each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection point between one pixel unit and the other pixel units is connected with a corresponding signal readout terminal; wherein two adjacent pixel modules share a same pixel unit and signal readout terminals connected with the first terminal and the second terminal of the same pixel unit. The signal acquisition method includes: performing signal acquisition on the n signal readout terminals successively for each pixel module in a single signal acquisition period, wherein the signal acquisition period includes n sub-periods, and each sub-period corresponds to at least one signal readout terminal; controlling respective pixel switches of a first pixel unit and a second pixel unit to be switched on, controlling a current to flow through the first pixel unit and the second pixel unit, and collecting a first electrical signal of an i-th signal readout terminal in an i-th sub-period, wherein the first pixel unit and the second pixel unit are two pixel units connected with the i-th signal readout terminal in the n signal readout terminals, and 1≤i≤n.

In some embodiments, the first electrical signal is a differential mode signal of the first pixel unit and the second pixel unit.

In some embodiments, the signal acquisition method further includes: collecting a second electrical signal of a signal readout terminal connected with a serial connection point between the first pixel unit and a third pixel unit in the i-th sub-period, wherein the third pixel unit is a pixel unit other than the second pixel unit in the n pixel units; and/or collecting a second electrical signal of a signal readout terminal connected with a serial connection point between the second pixel unit and a fourth pixel unit, wherein the fourth pixel unit is a pixel unit other than the second pixel unit in the n pixel units.

In some embodiments, the second electrical signal is a common mode signal of the first pixel unit and the second pixel unit.

In some embodiments, when each sub-period corresponds to x signal readout terminals, and 2≤x<n, controlling respective pixel switches of x+1 pixel units connected in series in the n pixel units to be switched on, controlling a current to flow through the x+1 pixel units, and collecting a first electrical signal of the x signal readout terminals respectively in the i-th sub-period, wherein the serial connection points between two pixel units in the x+1 pixel units are respectively connected with the x signal readout terminals.

In some embodiments, the signal acquisition method further includes: collecting a second electrical signal of a signal readout terminal connected with a serial connection point between a first pixel unit and a third pixel unit within the x+1 pixel units in the i-th sub-period, wherein the third pixel unit is a pixel unit other than the x+1 pixel units in the n pixel units; and/or collecting a second electrical signal of a signal readout terminal connected with a serial connection point between a last pixel unit and a fourth pixel unit within the x+1 pixel units, wherein the fourth pixel unit is a pixel unit other than the x+1 pixel units within the n pixel units.

Another embodiment of the present disclosure provides a signal acquisition circuit of an image sensor. The image sensor includes a plurality of pixel modules, and each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection points between one pixel unit and the other pixel unit is connected with a corresponding signal readout terminal; wherein two adjacent pixel modules share a same pixel unit and signal readout terminals connected with the first terminal and the second terminal of the same pixel unit. For each pixel module, signal acquisition is performed on the n signal readout terminals successively by the signal acquisition circuit in a single signal acquisition period, the signal acquisition period includes n sub-periods, and each sub-period corresponds to at least one signal readout terminal. The signal acquisition circuit includes: a pixel switch control unit for controlling respective pixel switches of a first pixel unit and a second pixel unit to be switched on in an i-th sub-period, wherein the first pixel unit and the second pixel unit are two pixel units connected with an i-th signal readout terminal within the n signal readout terminals, and $1 \leq i \leq n$; a scanning line control unit for controlling a current to flow through the first pixel unit and the second pixel unit in the i-th sub-period; and a signal readout unit for collecting a first electrical signal of the i-th signal readout terminal in the i-th sub-period.

In some embodiments, the pixel switch control unit is coupled with a plurality of control lines, and control terminals of different pixel switches in a same pixel module are connected with different control lines; the signal readout unit is coupled with a plurality of data lines, and each signal readout terminal is connected with a corresponding data line; and the scanning line control unit is coupled with a plurality of scanning lines, and each photosensitive element is connected with a corresponding scanning line.

In some embodiments, the first electrical signal is a differential mode signal of the first pixel unit and the second pixel unit.

In some embodiments, a second electrical signal of a signal readout terminal connected with a serial connection point between the first pixel unit and a third pixel unit is collected by the signal readout unit in the i-th sub-period, and the third pixel unit is a pixel unit other than the second pixel unit in the n pixel units; and/or a second electrical signal of a signal readout terminal connected with a serial connection point between the second pixel unit and a fourth pixel unit is collected by the signal readout unit, and the fourth pixel unit is a pixel unit other than the second pixel unit in the n pixel units.

In some embodiments, the second electrical signal is a common mode signal of the first pixel unit and the second pixel unit.

In some embodiments, when each sub-period corresponds to x signal readout terminals, and $2 \leq x < n$, respective pixel switches of x+1 pixel units connected in series in the n pixel units are controlled by the pixel switch control unit to be switched on in the i-th sub-period; a current is controlled by the scanning line control unit to flow through the x+1 pixel units; and first electrical signals of the x signal readout terminals are collected by the signal readout unit, and the serial connection points between two pixel units in the x+1 pixel units are respectively connected with the x signal readout terminals.

In some embodiments, a second electrical signal of a signal readout terminal connected with a serial connection point between a first pixel unit and a third pixel unit in the x+1 pixel units is collected by the signal readout unit in the i-th sub-period, and the third pixel unit is a pixel unit other than the x+1 pixel units in the n pixel units; and/or a second electrical signal of a signal readout terminal connected with a serial connection point between a last pixel unit and a fourth pixel unit in the x+1 pixel units is collected by the signal readout unit, and the fourth pixel unit is a pixel unit other than the x+1 pixel units in the n pixel units.

Another embodiment of the present disclosure provides a storage medium. The storage medium has computer instructions stored thereon, wherein the computer instructions are executed to perform steps of the signal acquisition method.

Another embodiment of the present disclosure provides a terminal. The terminal includes a memory having computer instructions stored thereon and a processor, wherein the computer instructions are executed by the processor to perform steps of the signal acquisition method.

Compared with conventional technologies, embodiments of the present disclosure have following beneficial effects.

An embodiment of the present disclosure provides an image sensor. The image sensor includes a plurality of pixel modules. Each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection point between one pixel unit and the other pixel unit is connected with a corresponding signal readout terminal, wherein two adjacent pixel modules share a same pixel unit and signal readout terminals connected with the first terminal and the second terminal of the same pixel unit.

Compared with a device design of an existing image sensor in which all pixel units are connected in parallel, the solution of embodiments in the present disclosure can utilize the compatibility in the manufacturing process so that the plurality of pixel units can be connected in series, thereby the differential mode signal and the common mode signal can be independently read out in a single signal acquisition period, which is beneficial to obtain the complete signal of the pixel units. Specifically, each serial connection point is connected with a signal readout terminal, so that the differential mode signal between two pixel units connected in series through the corresponding serial connection point can be read out at the signal readout terminal. Further, the common mode signal of the two pixel units can be read through the signal readout terminals connected with the serial connection points between the two pixel units and other pixel units other than the two pixel units. Furthermore, the design of the closed-loop structure enables the differential mode signal of each pixel unit of the n pixel units to be extracted from the complete signal so as to be collected independently. Furthermore, two adjacent pixel modules share a same pixel unit and the signal readout terminals connected with the first terminal and the second terminal of the same pixel unit, which is beneficial to obtain a more compact device component arrangement and decrease costs. Further, such device component arrangement is also beneficial to minimize the number of control lines, data lines, and scanning lines, and reduce the complexity of wirings in the image sensor.

Further, another embodiment of the present disclosure provides a signal acquisition method of an image sensor. The image sensor includes a plurality of pixel modules. Each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection point between one pixel unit and other pixel unit is connected with a corresponding signal readout terminal; wherein two adjacent pixel modules share a same pixel unit and signal readout terminals connected with the first terminal and the second terminal of the same pixel unit. The signal acquisition method includes: performing signal acquisition on the n signal readout terminals successively for each pixel module in a single signal acquisition period, wherein the signal acquisition period includes n sub-periods, and each sub-period corresponds to at least one signal readout terminal; controlling respective pixel switches of a first pixel unit and a second pixel unit to be switched on, controlling a current to flow through the first pixel unit and the second pixel unit, and collecting a first electrical signal of an i-th signal readout terminal in an i-th sub-period, wherein the first pixel unit and the second pixel unit are two pixel units connected with the i-th signal readout terminal in the n signal readout terminals, and 1≤i≤n. With the solution of this embodiment, a weak differential mode signal can be separated and extracted from the complete signal, which can greatly improve the imaging quality of the image sensor.

Further, another embodiment of the present disclosure provides a signal acquisition circuit of an image sensor. The image sensor includes a plurality of pixel modules. Each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection points between one pixel unit and the other pixel unit is connected with a corresponding signal readout terminal; wherein two adjacent pixel modules share a same pixel unit and signal readout terminals connected with the first terminal and the second terminal of the same pixel unit. For each pixel module, signal acquisition is performed on the n signal readout terminals successively by the signal acquisition circuit in a single signal acquisition period, and the signal acquisition period includes n sub-periods, and each sub-period corresponds to at least one signal readout terminal. The signal acquisition circuit includes: a pixel switch control unit for controlling respective pixel switches of a first pixel unit and a second pixel unit to be switched on in an i-th sub-period, wherein the first pixel unit and the second pixel unit are two pixel units connected with an i-th signal readout terminal within the n signal readout terminals, and 1≤i≤n; a scanning line control unit for controlling a current to flow through the first pixel unit and the second pixel unit in the i-th sub-period; and a signal readout unit for collecting a first electrical signal of the i-th signal readout terminal in the i-th sub-period. With the solution of this embodiment, a weak differential mode signal can be separated and extracted from the complete signal through the signal acquisition circuit. Further, the signal acquisition circuit has the function of reading the differential mode signal and the common mode signal separately, which is beneficial to obtain the complete signal and can greatly improve the imaging quality of the image sensor.

DETAILED DESCRIPTION

As mentioned in the background, the arrangement of the pixel array in the existing image sensor and the reading method of the signal acquisition circuit have many defects.

Figure 1:
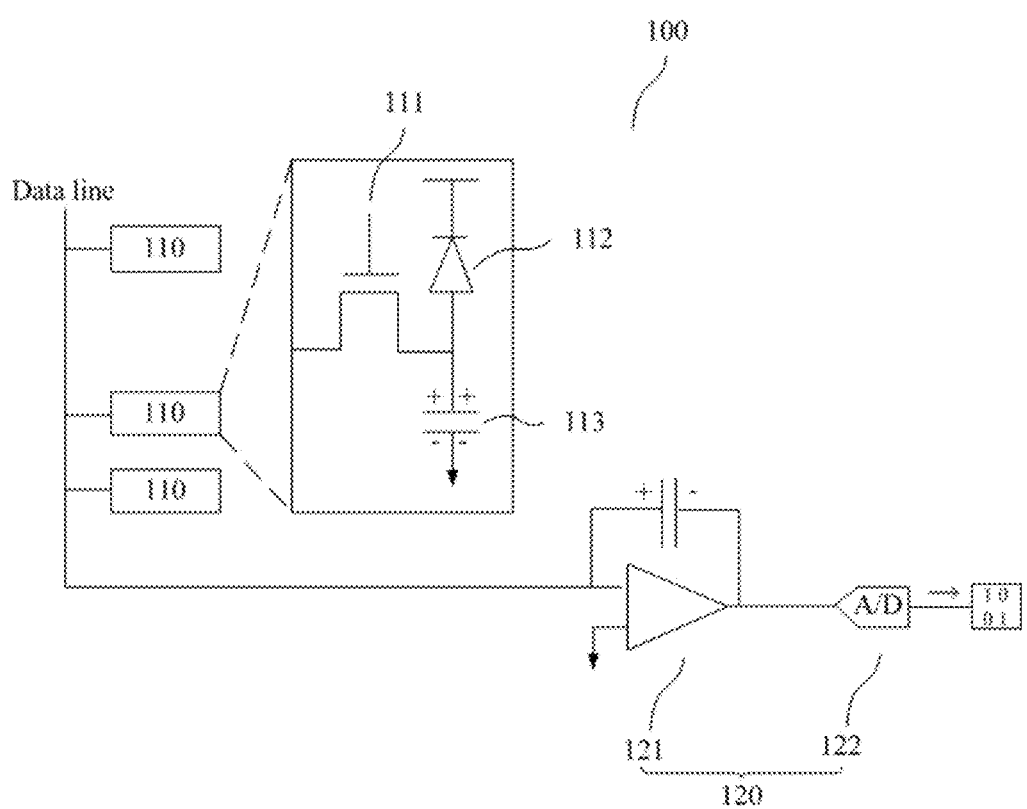
FIG. 1 is a schematic diagram of an image sensor in the prior art.

Specifically, referring to FIG. 1, an existing image sensor 100 is composed of a plurality of pixel units 110 arranged in an array. For simplicity, only one column of pixel units 110 is shown in FIG. 1. Further, each pixel unit 110 includes a photosensitive element 112, a pixel switch 111, and a capacitor 113.

In each pixel unit 110, one end (such as a cathode) of the photosensitive element 112 is connected to a common electrode (such as grounded), and the other end (such as an anode) of the photosensitive element 112 is connected with the pixel switch 111 of respective pixel unit. The pixel switch 111 is connected with a same data line, and a control terminal of the pixel switch 111 is connected with a scanning line (not shown).

During an image acquisition process, for each pixel unit 110, the photosensitive element 112 generates a leakage current under light illumination, and forms a charge stored in the corresponding capacitor 113, and then the capacitor 113 is read one by one through the scanning line to an external acquisition module 120 in a specific switch-on sequence. The external acquisition module 120 includes an external amplifier 121 and an analog-to-digital converter 122 to convert and read images from light signals to electrical signals to digital signals.

The signal acquisition process of the existing image sensor 100 has following disadvantages.

First, two signal reading processes are required for external signal reading: the first is background information reading, the second is actual signal reading, and the two signals are calculated to get a difference value. This kind of operation is time-consuming and requires external operation to get a differential mode signal.

Second, referring to FIG. 1, since the cathodes and anodes of all the pixel units 110 are respectively connected in parallel, the signal finally read by each pixel unit 110 only includes a total signal of a common mode signal and a differential mode signal, and the differential mode signal can be calculated only after being digitized by the analog-to-digital converter 122. However, after being digitized by the analog-to-digital converter 122, the differential mode signal is often ignored because it is too weak, which leads to a loss of more detailed eigenvalue signal.

Figure 2:
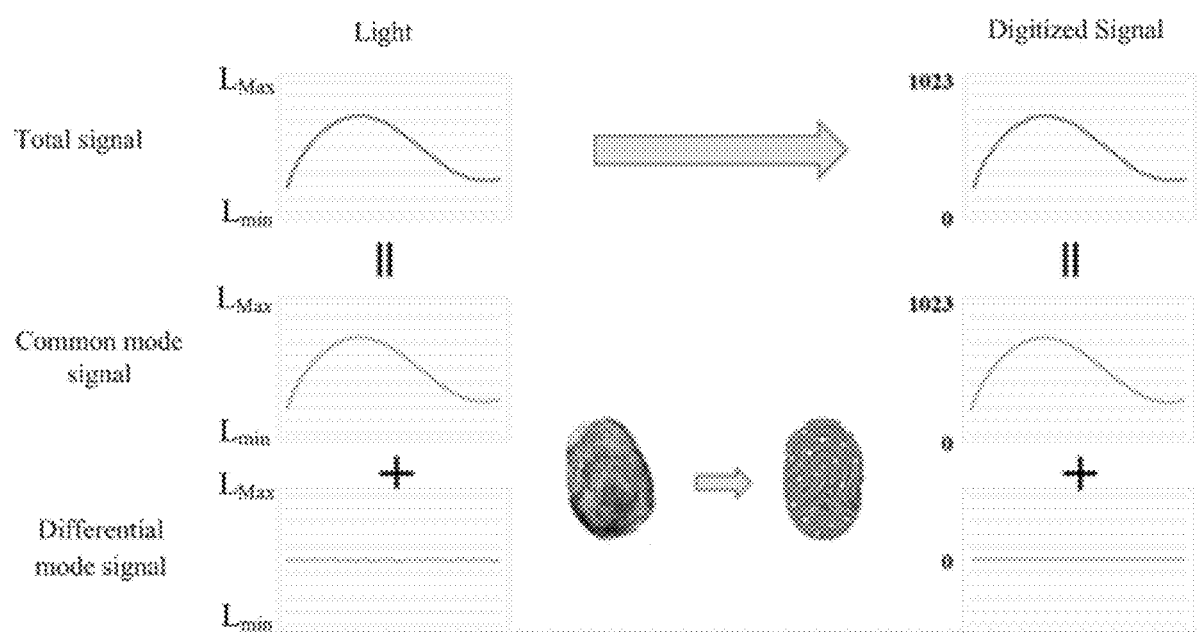
FIG. 2 is a schematic diagram of signals collected by the image sensor shown in FIG. 1.

For example, referring to FIG. 2, for the plurality of pixel units 110, after light signals obtained by sensing are processed by an analog-to-digital conversion, part of the differential mode signal calculated from two total signals including the common mode signal and the differential mode signal is ignored because the data is too weak, resulting in the finally obtained digital signal basically only including an original input common mode signal, thus it is difficult to obtain an accurate differential mode signal.

It seems that such signal loss will not have a great impact on the general outline of the final imaging, but it is bound to have an impact on the imaging quality in details, resulting in low imaging quality, local detail loss and low resolution.

In order to solve the above technical problems, an embodiment of the present disclosure provides an image sensor including a plurality of pixel modules, and each pixel module includes: n pixel units connected in series to form a closed-loop structure, wherein n≥3, each pixel unit has a first terminal and a second terminal, and each pixel unit includes a photosensitive element and a pixel switch connected in series; and n signal readout terminals, wherein each serial connection point between one pixel unit and the other pixel unit is connected with a corresponding signal readout terminal; wherein two adjacent pixel modules share a same pixel unit and the signal readout terminals connected with the first terminal and the second terminal of the same pixel unit.

The solution of this embodiment makes use of the compatibility in the process, and the plurality of pixel units can be connected in series, thereby the differential mode signal and the common mode signal can be independently read out in a single signal acquisition period, which is beneficial to obtain the complete signal of the pixel units. Specifically, each serial connection point is connected with a signal readout terminal, so that the differential mode signal between two pixel units connected in series through the corresponding serial connection point can be read out at the signal readout terminal. Further, the common mode signal of the two pixel units can be read through the signal readout terminal connected with the serial connection point between the two pixel units and other pixel units other than the two pixel units. Furthermore, the design of the closed-loop structure enables the differential mode signal of each pixel unit of the n pixel units to be extracted from the complete signal so as to be collected independently. Furthermore, two adjacent pixel modules share a same pixel unit and the signal readout terminals connected with the first terminal and the second terminal of the same pixel unit, which is beneficial to obtain a more compact device arrangement and achieve the effect of reducing cost. Furthermore, such a device arrangement can also minimize the number of control lines, data lines and scanning lines, and reduce the complexity of wirings in the image sensor.

In order to make above objects, features and beneficial effects of the present disclosure more obvious and understandable, specific embodiments of the present disclosure will be described in detail below with reference to the accompanying drawings.

Figure 3:
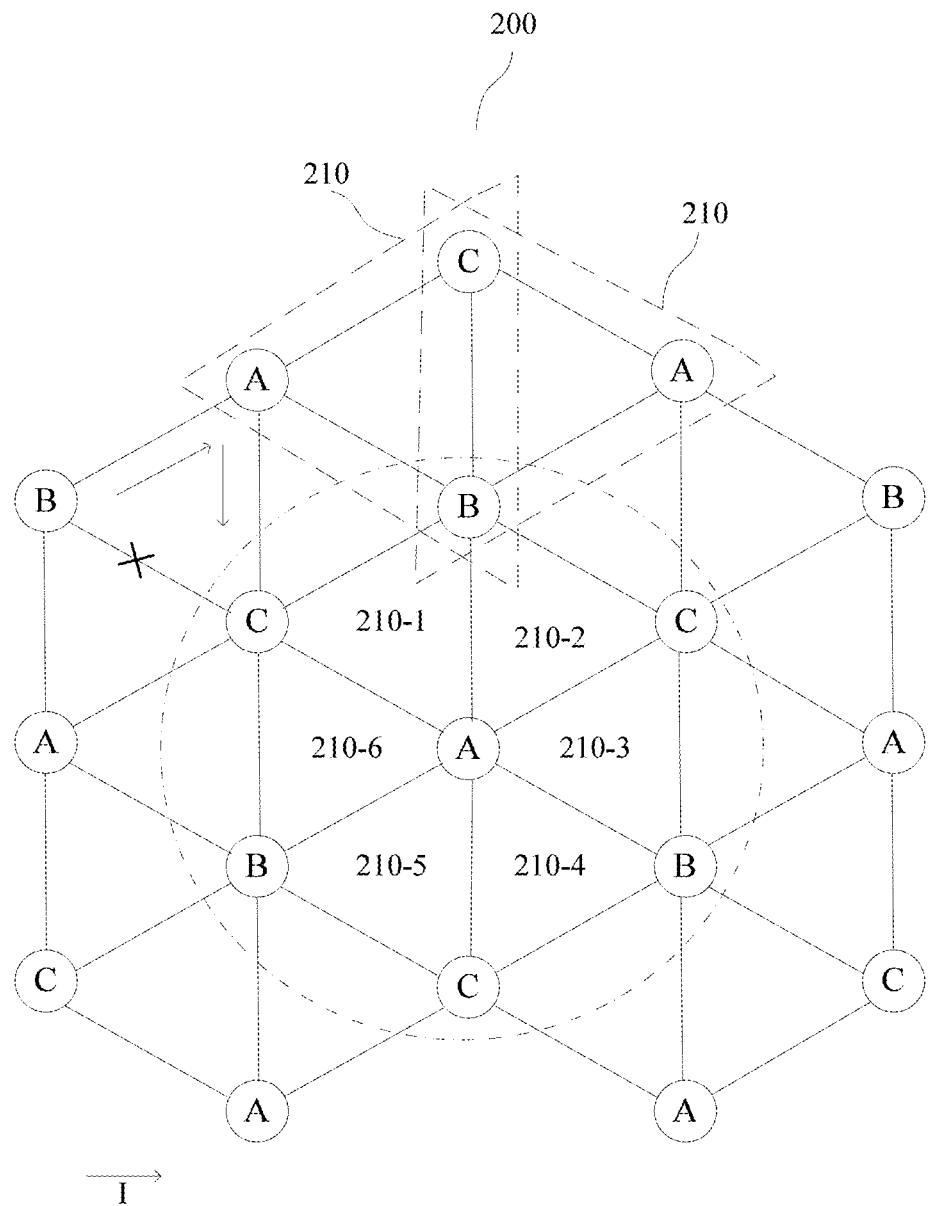
FIG. 3 is a schematic diagram of an image sensor according to a first embodiment of the present disclosure.
Figure 4:
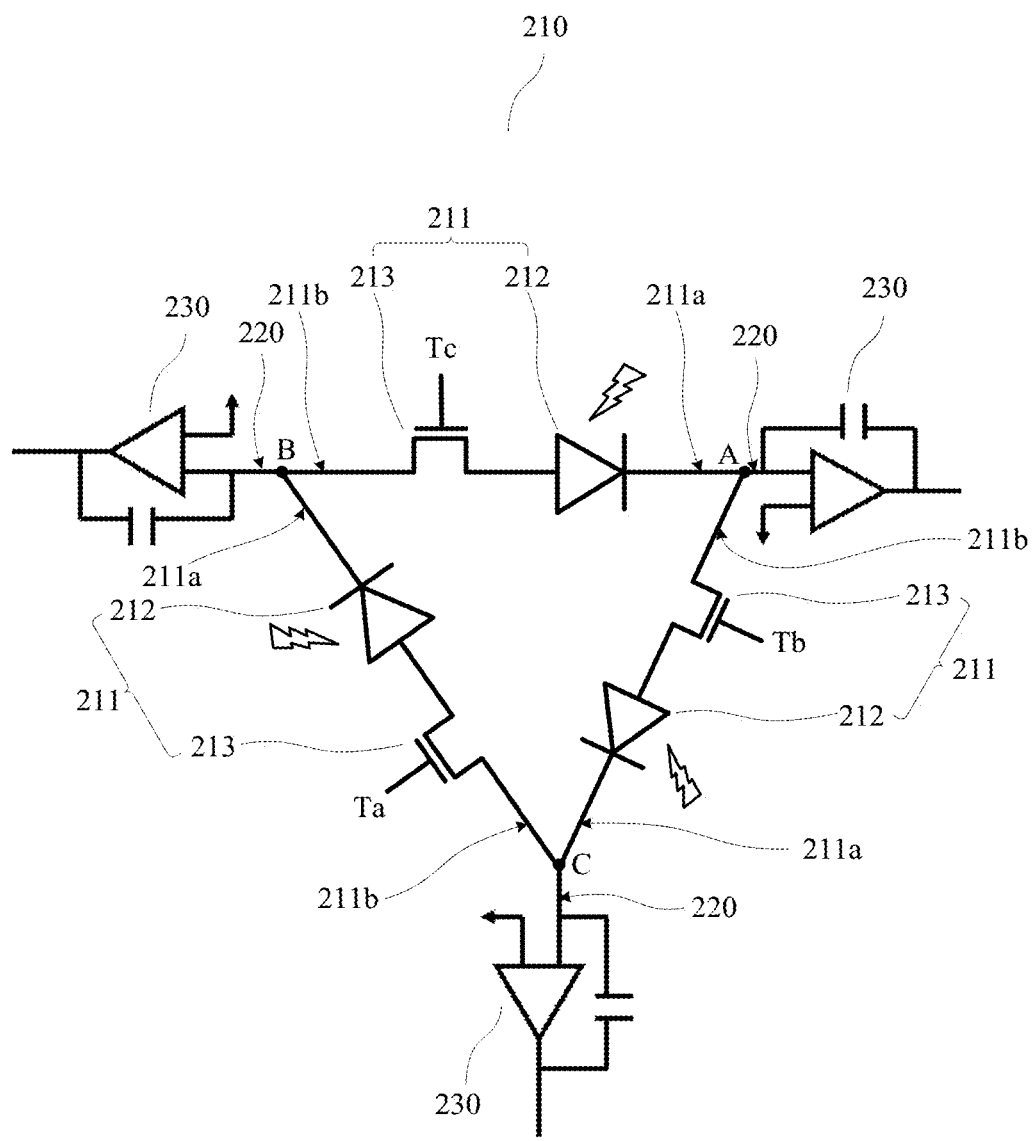
FIG. 4 is a schematic diagram of a single pixel module in the embodiment shown in FIG. 3.
Figure 5:
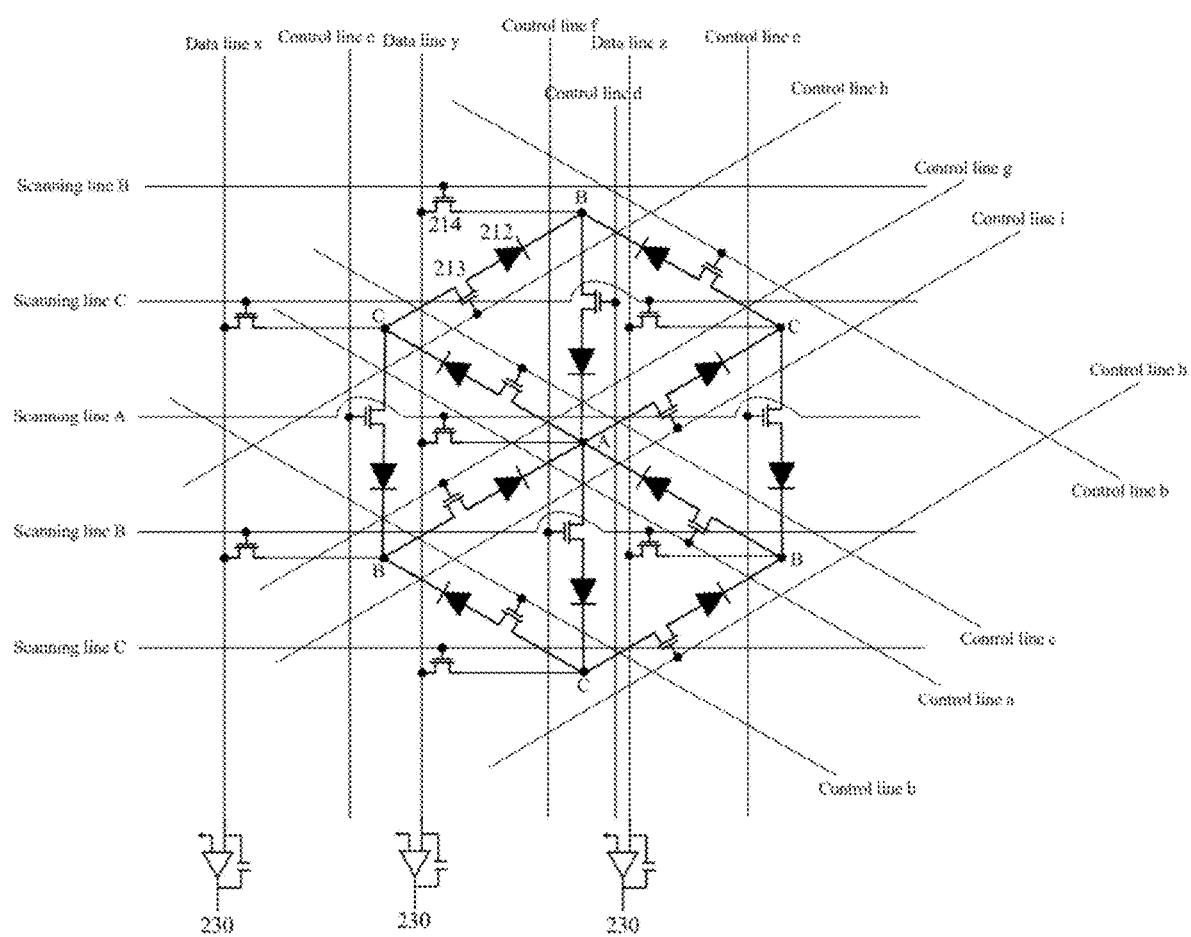
FIG. 5 is a schematic diagram of a circuit connection of a plurality of pixel modules in the embodiment shown in FIG. 3.

FIG. 3 is a schematic diagram of an image sensor according to a first embodiment of the present disclosure, FIG. 4 is a schematic diagram of a single pixel module in the embodiment shown in FIG. 3, and FIG. 5 is a schematic diagram of a circuit connection of a plurality of pixel modules in the embodiment shown in FIG. 3.

The image sensor described in the embodiment can be applied to an image acquisition scene, such as an optical fingerprint acquisition scene. For example, the image sensor may be an optical fingerprint sensor.

In order to more clearly show the structure of an image sensor 200 shown in FIG. 3, specific structure within a pixel module 210 and an external amplifier 230 are not shown in FIG. 3, and only serial connection points A, B and C are remained to show the connection between multiple pixel modules 210.

In order to more clearly show the wiring design in the image sensor 200 in this embodiment, FIG. 5 only shows an example of a circuit connection of six adjacent pixel modules 210 framed by dash dot lines in FIG. 3, which enables the differential mode signal and the common mode signal of each signal readout terminal 220 to be read by a minimized number of control signals.

Specifically, referring to FIGS. 3 and 4, the image sensor 200 may include a plurality of pixel modules 210, and each pixel module 210 may include: n pixel units 211 connected in series to form a closed-loop structure, wherein each pixel unit 211 has a first terminal 211a and a second terminal 211b, and each pixel unit 211 includes a photosensitive element 212 and a pixel switch 213 connected in series; and n signal readout terminals 220, wherein serial connection points (marked with A, B and C in the figure) between each pixel unit 211 and other pixel units 211 are respectively connected with corresponding signal readout terminals 220, wherein two adjacent pixel modules 210 share a same pixel unit 211 and the signal readout terminals 220 connected with the first terminal 211a and the second terminal 211b of the same pixel unit 211.

More specifically, each signal readout terminal 220 may be connected with an external amplifier 230 to collect the signals collected by the corresponding pixel unit 211.

In some embodiment, n=3, and each pixel module 210 can form a triangle structure as shown in FIG. 4.

In some embodiment, n may be any positive integer greater than or equal to 3, so the pixel module 210 may form an n-gon structure, wherein each edge of the n-gon structure is provided with a pixel unit 211.

In some embodiment, for each pixel unit 211, the anode of the photosensitive element 212 in the pixel unit 211 is coupled with a source (or a drain) of the pixel switch 213.

In the embodiment as shown in FIG. 4, the cathode of the photosensitive element 212 in the pixel unit 211 is marked as the first terminal 211a of the pixel unit 211, and the drain (or the source) of the pixel switch 213 is marked as the second terminal 211b of the pixel unit 211. In practical application, those skilled in the art can adjust the first terminal 211a and the second terminal 211b of the pixel unit 211 as required. For example, the drain (or the source) of the pixel switch 213 is marked as the first terminal 211a of the pixel unit 211, and the cathode of the photosensitive element 212 is marked as the second terminal 211b of the pixel unit 211.

In some embodiment, the pixel switch 213 is usually a thin film transistor (TFT) device, and the photosensitive element 212 is used to collect external input light signals and convert them into electrical signals, which are then stored in the corresponding pixel unit 211.

For example, the pixel unit 211 may also include a capacitor (not shown) suitable for storing the electrical signals converted by the corresponding photosensitive element 212.

In some embodiment, the photosensitive element 212 may be a photodiode. The photodiode may include a PIN junction amorphous silicon photodiode, a PN junction amorphous silicon photodiode, a PIN junction low-temperature polysilicon photodiode, a PN junction low-temperature polysilicon photodiode, a PIN junction organic photodiode, or a PN junction organic photodiode, etc.

In practical application, the photosensitive element 212 may also be other photoelectric converter pieces that can be formed on a glass substrate.

In some embodiment, the signal readout terminal 220 and the corresponding serial connection point (A, B and C as shown in FIG. 4) may be coupled by wirings.

Alternatively, the signal readout terminal 220 and the corresponding serial connection point (A, B and C shown in FIG. 4) may be a same point.

In some embodiment, for two pixel units 211 connected in series, the coupling point between the first terminal 211a (or the second terminal 211b) of one pixel unit 211 and the second terminal 211b (or the first terminal 211a) of the other pixel unit 211 is the serial connection point of the two pixel units 211 (A, B and C shown in FIG. 4).

For example, referring to FIG. 4, the first terminal 211a of the pixel unit 211 on an upper edge of a triangle is coupled with the second terminal 211b of the pixel unit 211 on a right edge of the triangle to form a serial connection point A, the second terminal 211b of the pixel unit 211 on the upper edge of the triangle is coupled with the first terminal 211a of the pixel unit 211 on a left edge of the triangle to form a serial connection point B, and the first terminal 211a of the pixel unit 211 on the right edge of the triangle is coupled with the second terminal 211b on the left edge of the triangle to form a serial connection point C.

The serial connection points A, B and C are respectively connected with a signal readout terminal 220 to respectively connect with the external amplifier 230.

Taking two adjacent pixel modules 210 framed by dotted lines in FIG. 3 for example, the two adjacent pixel modules 210 share a same pixel unit 211, that is, the pixel unit 211 located on an adjacent side C-B. Further, the two adjacent pixel modules 210 also share the signal readout terminal 220 connected with the serial connection point C and the signal readout terminal 220 connected with the serial connection point B. Thus, the device arrangement is more compact and the cost is reduced.

In some embodiment, the number of the pixel modules 210 may be 22, as shown in FIG. 3. In practical application, those skilled in the art may also adjust the specific number of the pixel modules 210 as required.

In order to clearly show the wiring design in FIG. 5, referring to FIGS. 3 and 5, six pixel modules 210 shown in FIG. 5 are successively numbered as pixel modules 210-1 to 210-6 in a clockwise direction starting from an upper left corner.

In some embodiment, referring to FIGS. 4 and 5, the image sensor 200 may also include: a plurality of control lines (marked with a-i in the figure). In a same pixel module 210, control terminals of different pixel switches 213 (marked with Ta, Tb and Tc in FIG. 4) are connected with different control lines to ensure that three pixel switches 213 will not be switched on at the same time in a single signal acquisition period.

Taking the pixel module 210-1 for example, referring to FIG. 5, the pixel module 210-1 includes three pixel units 211 connected in series to form a triangle, and three vertices of the triangle are the serial connection points A, B and C of two adjacent pixel units 211 connected in series. The control terminal (corresponding to the control terminal Ta shown in FIG. 4) of the pixel switch 213 on an edge formed by connecting the serial connection point B and the serial connection point C is connected with a control line h, the control terminal (corresponding to the control terminal Tc shown in FIG. 4) of the pixel switch 213 on an edge formed by connecting the serial connection point B and the serial connection point A is connected with a control line d, and the control terminal (corresponding to the control terminal Tb shown in FIG. 4) on an edge formed by connecting the serial connection point A and the serial connection point C is connected with a control line c.

Taking the pixel module 210-2 for example, the pixel module 210-2 and the pixel module 210-1 share the serial connection point B, the serial connection point A and the pixel unit 211 on the edge formed by connecting the serial connection point B and the serial connection point A. Further, the control terminal of the pixel switch 213 on the edge formed by connecting the serial connection point B and the serial connection point C of the pixel module 210-2 is connected with a control line b, and the control terminal of the pixel switch 213 on the edge formed by connecting the serial connection point C and the serial connection point A of the pixel module 210-2 is connected with a control line i.

Taking the pixel module 210-3 for example, the pixel module 210-3 and the pixel module 210-2 share the serial connection point A, the serial connection point C and the pixel unit 211 on the edge formed by connecting the serial connection point A and the serial connection point C. Further, the control terminal of the pixel switch 213 on the edge formed by connecting the serial connection point C and the serial connection point B of the pixel module 210-3 is connected with a control line e, and the control terminal of the pixel switch 213 on the edge formed by connecting the serial connection point B and the serial connection point A of the pixel module 210-3 is connected with a control line a.

Taking the pixel module 210-4 for example, the pixel module 210-4 and the pixel module 210-3 share the serial connection point A, the serial connection point B and the pixel unit 211 on the edge formed by connecting the serial connection point A and the serial connection point B. Further, the control terminal of the pixel switch 213 on the edge formed by connecting the serial connection point C and the serial connection point B of the pixel module 210-4 is connected with the control line h, and the control terminal of the pixel switch 213 on the edge formed by connecting the serial connection point C and the serial connection point A of the pixel module 210-4 is connected with a control line f.

Taking the pixel module 210-5 for example, the pixel module 210-5 and the pixel module 210-4 share the serial connection point A, the serial connection point C and the pixel unit 211 on the edge formed by connecting the serial connection point A and the serial connection point C. Further, the control terminal of the pixel switch 213 on the edge formed by connecting the serial connection point C and the serial connection point B of the pixel module 210-5 is connected with the control line b; and the control terminal of the pixel switch 213 on the edge formed by connecting the serial connection point B and the serial connection point A of the pixel module 210-5 is connected with a control line g.

Taking the pixel module 210-6 for example, the pixel module 210-6 and the pixel module 210-5 share the serial connection point A, the serial connection point B and the pixel unit 211 on the edge formed by connecting the serial connection point A and the serial connection point B. Further, the pixel module 210-6 and the pixel module 210-1 share the serial connection point A, the serial connection point C and the pixel unit 211 on the edge formed by connecting the serial connection point A and the serial connection point C. Further, the control terminal of the pixel switch 213 on the edge formed by connecting the serial connection point C and the serial connection point B of the pixel module 210-6 is connected with the control line e.

In other words, in an application scenario of n=3, taking any serial connection point of the pixel module 210 as a center point, a most compact arrangement structure shown in FIG. 5 can be obtained, and the arrangement structure is a hexagonal structure composed of six pixel modules 210, wherein all pixel modules 210 share a serial connection point, and the remaining two serial connection points of one pixel module 210 are shared by the one pixel module 210 and another adjacent pixel module 210 on the left and right respectively.

To ensure that the differential mode signal of each serial connection point can be accurately measured, referring to FIG. 5, it can be seen that when the serial connection point A is the common serial connection point of all pixel modules 210, two pixel switches 213 on any edge C-A-B are respectively connected with different control lines. Further, two pixel switches 213 on any edge C-A-C or any edge B-A-B are also connected with different control lines, respectively. That is, respective pixel switches 213 of the plurality of pixel units 211 sharing the serial connection point are respectively connected with different control lines.

Further, to minimize the number of the control lines, some pixel modules 210 may share a control line.

In some embodiment, respective pixel switches 213 of the plurality of pixel units 211 that do not share a serial connection point may be connected with a same control line.

Further, when n=3, respective pixel switches 213 of the plurality of pixel units 211 on edges parallel to each other may be connected with a same control line.

For example, referring to FIG. 5, both the control terminal of the pixel switch 213 on the edge formed by connecting the serial connection point C and the serial connection point B of the pixel module 210-3 and the control terminal of the pixel switch 213 on the edge formed by connecting the serial connection point C and the serial connection point B of the pixel module 210-6 may be connected with the control line e.

In order to more clearly show the details of the circuit connection, the two control terminals are respectively connected with the control line e in FIG. 5. In practical applications, the control line e may include two independent control lines which are connected with a same scanning line control unit and have a same timing design, or, in actual wiring, the control line e may include one control line.

Similarly, both the control terminal of the pixel switch 213 on the edge formed by connecting the serial connection point C and the serial connection point B of the pixel module 210-2 and the control terminal of the pixel switch 213 on the edge formed by connecting the serial connection point C and the serial connection point B of the pixel module 210-5 may be connected with the control line b.

Similarly, both the control terminal of the pixel switch 213 on the edge formed by connecting the serial connection point C and the serial connection point B of the pixel module 210-1 and the control terminal of the pixel switch 213 on the edge formed by connecting the serial connection point C and the serial connection point B of the pixel module 210-4 may be connected with the control line h.

In some embodiment, referring to FIGS. 4 and 5, the image sensor 200 may also include: a plurality of data lines, and each signal readout terminal 220 is connected with a corresponding data line (marked with x, y and z in the figure).

Further, each data line is connected with the corresponding external amplifier 230 to read the output signal of the corresponding signal readout terminal 220.

In an application scenario of n=3, the signal readout terminals 220 respectively connected with three serial connection points of the same pixel module 210 are connected with at least two data lines.

Taking the pixel module 210-1 for example, referring to FIG. 5, the signal readout terminals 220 respectively connected with the serial connection point A and the serial connection point B of the pixel module 210-1 are connected with the data line y, and the signal readout terminal 220 connected with the serial connection point C of the pixel module 210-1 is connected with the data line x.

Taking the pixel module 210-2 for example, the pixel module 210-2 and the pixel module 210-1 share the serial connection point B and the serial connection point A. Further, the signal readout terminal 220 connected with the serial connection point C of the pixel module 210-2 is connected with the data line z.

Taking the pixel module 210-3 for example, the pixel module 210-3 and the pixel module 210-2 share the serial connection point C and the serial connection point A. Further, the signal readout terminal 220 connected with the serial connection point B of the pixel module 210-3 is connected with the data line z.

Taking the pixel module 210-4 for example, the pixel module 210-4 and the pixel module 210-3 share the serial connection point B and the serial connection point A. Further, the signal readout terminal 220 connected with the serial connection point C of the pixel module 210-4 is connected with the data line y.

Taking the pixel module 210-5 for example, the pixel module 210-5 and the pixel module 210-4 share the serial connection point C and the serial connection point A. Further, the signal readout terminal 220 connected with the serial connection point B of the pixel module 210-5 is connected with the data line x.

Taking the pixel module 210-6 for example, the pixel module 210-6 and the pixel module 210-5 share the serial connection point B and the serial connection point A. Further, the signal readout terminal 220 connected with the serial connection point C of the pixel module 210-6 is connected with the data line x.

In some embodiment, referring to FIG. 4, for a same pixel module 210, different signal readout terminals 220 can be connected with different data lines to ensure that the signal of each signal readout terminal 220 can be read accurately and timely.

In some embodiment, in order to reduce the number of wirings, some pixel modules 210 may share a data line.

Further, for each data line, taking a straight line parallel to the data line as a reference, all signal readout terminals 220 connected with the serial connection points on the same straight line are connected with a same data line.

For example, referring to FIG. 5, the signal readout terminals 220 respectively connected with the serial connection point C shared by the pixel module 210-1 and the pixel module 210-6 and the serial connection point B shared by the pixel module 210-6 and the pixel module 210-5 are connected with the data line x.

For another example, the signal readout terminals 220 respectively connected with the serial connection point A and the serial connection point B shared by the pixel module 210-1 and the pixel module 210-2 and the serial connection point C shared by the pixel module 210-5 and the pixel module 210-4 are connected with the data line y.

For another example, the signal readout terminals 220 respectively connected with the serial connection point C shared by the pixel module 210-2 and the pixel module 210-3 and the serial connection point B shared by the pixel module 210-3 and the pixel module 210-4 are connected with the data line z.

In some embodiment, for each signal readout terminal 220, the signal readout terminal 220 is connected with a corresponding data line through a switch module 214.

For example, the switch module 214 may be a TFT device.

Further, a control terminal (such as a gate) of the switch module 214 may be connected with a corresponding scanning line, and a source and a drain of the switch module 214 are respectively connected with corresponding data line and signal readout terminal 220.

In some embodiment, referring to FIGS. 4 and 5, the image sensor 200 may further include: a plurality of scanning lines (marked with A, B, and C in the figure), and each photosensitive element 212 is connected with a corresponding scanning line.

In an application scenario of n=3, three photosensitive elements 212 of the same pixel module 210 may be connected with different scanning lines respectively. Therefore, on or off of a current at the edge on which each photosensitive element 212 is located can be controlled through three scanning lines independently. Moreover, with the cooperative control of each scanning line, at least two edges on which the photosensitive element 212 in the pixel module 210 is located may be successively controlled to generate a current flowing therethrough in a single signal acquisition period so as to obtain the common mode signal and the differential mode signal of the pixel unit 211 including the two photosensitive elements 212.

Further, the serial connection point connected with the cathode of the photosensitive element 212 (corresponding to the first terminal 211a of the pixel unit 211 shown in FIG. 4) is connected with the source (or the drain) of the corresponding switch module 214, the drain (or the source) of the switch module 214 is connected with the corresponding data line, and the gate of the switch module 214 is connected with the corresponding scanning line. The switch module 214 has a one-to-one corresponding relationship with the scanning line and the data line.

During signal acquisition, the corresponding switch module 214 is switched on, and a reverse bias voltage is applied to the corresponding photosensitive element 212 through the scanning line.

When the pixel switch 213 connected with the photosensitive element 212 applied with the reverse bias voltage is switched on under the control of the coupled control line, the electrical signal in the photosensitive element 212 under the reverse bias voltage can be transmitted to the serial connection points at both ends of the edge on which the photosensitive element 212 is located, then transmitted to the data line connected with the serial connection point, and finally transmitted to the corresponding external amplifier 230 through the data line to realize the signal acquisition.

When respective photosensitive elements 212 of two pixel units 211 sharing a same serial connection point are simultaneously applied with a reverse bias voltage, and the pixel switches 213 respectively connected with the two photosensitive elements 212 are switched on under the control of the coupled control lines, the current flows through the two pixel units 211 successively. At this time, the electrical signal from the serial connection point shared by the two pixel units 211 is the differential mode signal of the two pixel units 211, which can be transmitted to the corresponding external amplifier 230 via the data line connected with the serial connection point. Further, the electrical signals from the serial connection points which are not shared by the two pixel units 211 are respective common mode signals of the two pixel units 211, which can be transmitted to the corresponding external amplifier 230 via the data line connected with the corresponding serial connection point.

Taking the pixel module 210-1 for example, referring to FIG. 5, the photosensitive element 212 on the edge formed by connecting the serial connection point B and the serial connection point C of the pixel module 210-1 is connected with a scanning line B via the serial connection point B, the photosensitive element 212 on the edge formed by connecting the serial connection point B and the serial connection point A of the pixel module 210-1 is connected with a scanning line A via the serial connection point A, and the photosensitive element 212 on the edge formed by connecting the serial connection point C and the serial connection point A of the pixel module 210-1 is connected with a scanning line C via the serial connection point C.

Taking the pixel module 210-2 for example, the pixel module 210-2 and the pixel module 210-1 share the serial connection point B, the serial connection point A, and the pixel unit 211 on the edge formed by connecting the serial connection point B and the serial connection point A. Further, the photosensitive element 212 on the edge formed by connecting the serial connection point C and the serial connection point B of the pixel module 210-2 is connected with the scanning line B via the serial connection point B, and the photosensitive element 212 on the edge formed by connecting the serial connection point C and the serial connection point A of the pixel module 210-2 is connected with the scanning line C via the serial connection point C.

Taking the pixel module 210-3 for example, the pixel module 210-3 and the pixel module 210-2 share the serial connection point C, the serial connection point A, and the pixel unit 211 on the edge formed by connecting the serial connection point C and the serial connection point A. Further, the photosensitive element 212 on the edge formed by connecting the serial connection point C and the serial connection point B of the pixel module 210-3 is connected with the scanning line B via the serial connection point B, and the photosensitive element 212 on the edge formed by connecting the serial connection point B and the serial connection point A of the pixel module 210-3 is connected with the scanning line A via the serial connection point A.

Taking the pixel module 210-4 for example, the pixel module 210-4 and the pixel module 210-3 share the serial connection point B, the serial connection point A, and the pixel unit 211 on the edge formed by connecting the serial connection point B and the serial connection point A. Further, the photosensitive element 212 on the edge formed by connecting the serial connection point C and the serial connection point B of the pixel module 210-4 is connected with the scanning line B via the serial connection point B, and the photosensitive element 212 on the edge formed by connecting the serial connection point C and the serial connection point A of the pixel module 210-4 is connected with the scanning line C via the serial connection point C.

Taking the pixel module 210-5 for example, the pixel module 210-5 and the pixel module 210-4 share the serial connection point C, the serial connection point A, and the pixel unit 211 on the edge formed by connecting the serial connection point C and the serial connection point A. Further, the photosensitive element 212 on the edge formed by connecting the serial connection point C and the serial connection point B of the pixel module 210-5 is connected with the scanning line B via the serial connection point B, and the photosensitive element 212 on the edge formed by connecting the serial connection point B and the serial connection point A of the pixel module 210-5 is connected with the scanning line A via the serial connection point A.

Taking the pixel module 210-6 for example, the pixel module 210-6 and the pixel module 210-5 share the serial connection point B, the serial connection point A, and the pixel unit 211 on the edge formed by connecting the serial connection point B and the serial connection point A. Further, the photosensitive element 212 on the edge formed by connecting the serial connection point C and the serial connection point B of the pixel module 210-6 is connected with the scanning line B via the serial connection point B, and the photosensitive element 212 on the edge formed by connecting the serial connection point C and the serial connection point A of the pixel module 210-6 is connected with the scanning line C via the serial connection point C.

In some embodiment, in order to reduce the number of wirings, some pixel modules 210 may share a scanning line.

Further, for each scanning line, taking a straight line parallel to the scanning line as a reference, all serial connection points connected with the cathodes of the photosensitive elements 212 on the same straight line are connected with a same scanning line.

For example, referring to FIG. 5, the serial connection point B shared by the pixel module 210-1 and the pixel module 210-2 is connected with the scanning line B, the serial connection point A shared by the pixel modules 210-1 to 210-6 is connected with the scanning line A, and the serial connection point C shared by the pixel module 210-4 and the pixel module 210-5 is connected with the scanning line C.

For example, both the serial connection point C shared by the pixel module 210-1 and the pixel module 210-6 and the serial connection point C shared by the pixel module 210-2 and the pixel module 210-3 are connected with the scanning line C.

For another example, both the serial connection point B shared by the pixel module 210-3 and the pixel module 210-4 and the serial connection point B shared by the pixel module 210-5 and the pixel module 210-6 are connected with the scanning line B.

In order to clearly show the details of the circuit connection, FIG. 5 shows a plurality of scanning lines B and a plurality of scanning lines C. In practical application, the plurality of scanning lines B can be multiple independent scanning lines which are connected with a same scanning line control unit and have a same timing design. Similarly, the plurality of scanning lines C can be multiple independent scanning lines which are connected with a same scanning line control unit and have a same timing design. Or, in the actual wiring, the plurality of scanning lines B may be one scanning line. Similarly, the plurality of scanning lines C may be one scanning line.

In some embodiment, the plurality of pixel modules 210 may be formed on a glass substrate. Therefore, based on the non-conductive characteristics of the glass substrate, each pixel unit 211 formed on the glass substrate can be independent of each other, so that the serial connection between the pixel units 211 can be realized by a circuit design using the compatibility in the process.

In some embodiment, a signal acquisition method of the image sensor 200 may include: for each pixel module 210, performing signal acquisition on the n signal readout terminals 220 successively in a single signal acquisition period, wherein the signal acquisition period can include n subperiods, and each sub-period corresponds to at least one signal readout terminal 220.

In some embodiment, the sub period has a one-to-one correspondence relationship with the signal readout terminal 220.

Figure 6:
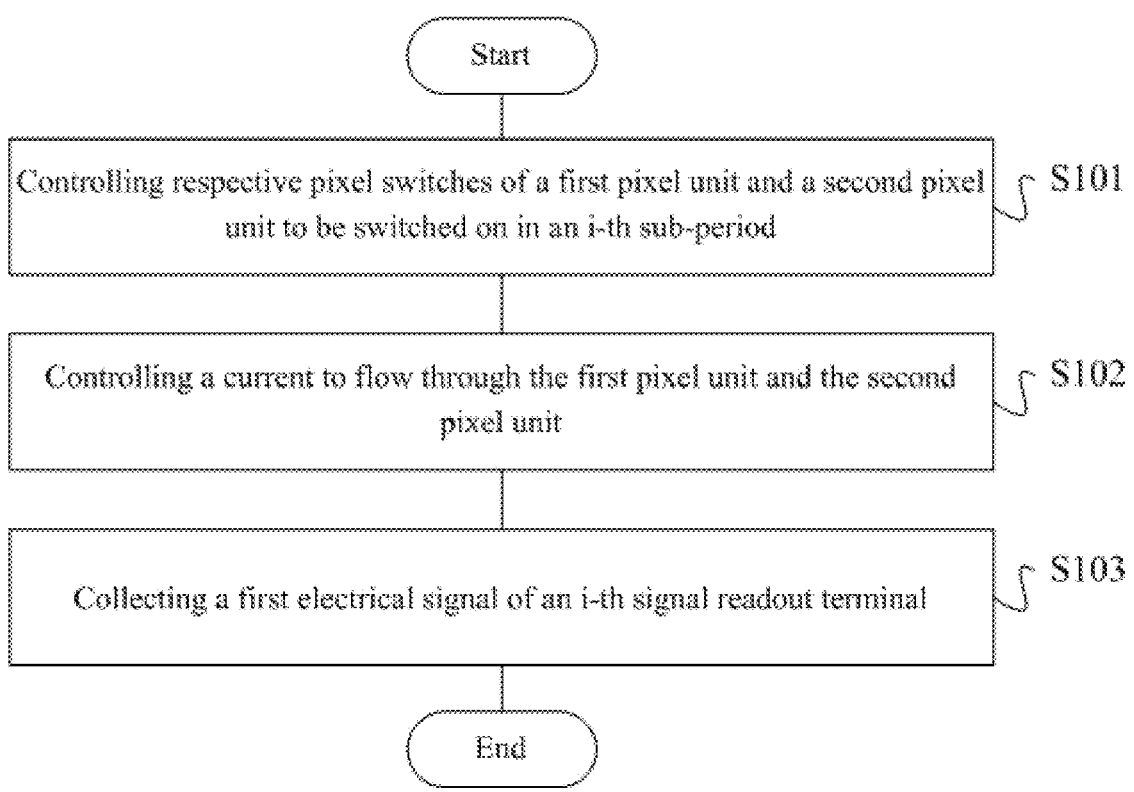
FIG. 6 is a flowchart of a signal acquisition method of the image sensor according to the first embodiment of the present disclosure.

Specifically, referring to FIG. 6, the signal acquisition method can include the following steps:

S101, in an i-th sub-period, controlling respective pixel switches of a first pixel unit and a second pixel unit to be switched on, and $1 \leq i \leq n$;

S102, controlling a current to flow through the first pixel unit and the second pixel unit; and S103, collecting a first electrical signal of an i-th signal readout terminal 220.

The first pixel unit and the second pixel unit are two pixel units 211 connected with the i-th signal readout terminal 220 in the n signal readout terminals 220.

Still taking the pixel module 210-1 shown in FIG. 5 for example, in the application scenario of n=3, and $1 \leq i \leq 3$, assuming that the signal readout terminal 220 connected with the serial connection point A of the pixel module 210-1 is the first signal readout terminal 220, the signal readout terminal 220 connected with the serial connection point B of the pixel module 210-1 is the second signal readout terminal 220, and the signal readout terminal 220 connected with the serial connection point C of the pixel module 210-1 is the third signal readout terminal 220.

When collecting the first electrical signal of the first signal readout terminal 220, the first pixel unit and the second pixel unit are the two pixel units 211 sharing the serial connection point A in the pixel module 210-1, that is, the first pixel unit is the pixel unit 211 on the edge formed by connecting the serial connection point C and the serial connection point A, and the second pixel unit is the pixel unit 211 on the edge formed by connecting the serial connection point B and the serial connection point A, or vice versa.

When collecting the first electrical signal of the second signal readout terminal 220, the first pixel unit and the second pixel unit are the two pixel units 211 sharing the serial connection point B in the pixel module 210-1, that is, the first pixel unit is the pixel unit 211 on the edge formed by connecting the serial connection point B and the serial connection point A, and the second pixel unit is the pixel unit 211 on the edge formed by connecting the serial connection point B and the serial connection point C, or vice versa.

When collecting the first electrical signal of the third signal readout terminal 220, the first pixel unit and the second pixel unit are the two pixel units 211 sharing the serial connection point C in the pixel module 210-1, that is, the first pixel unit is the pixel unit 211 on the edge formed by connecting the serial connection point C and the serial connection point A, and the second pixel unit is the pixel unit 211 on the edge formed by connecting the serial connection point C and the serial connection point B, or vice versa.

Further, the first electrical signal may be a differential mode signal of the first pixel unit and the second pixel unit.

In other words, in some embodiment, by controlling the current to flow through any two adjacent edges of the triangle, the differential mode signal between the pixel units 211 on the two adjacent sides can be collected through the connection point of the two adjacent edges.

In some embodiment, the signal acquisition period may include three sub-periods, and in each sub-period, the first electrical signal at a serial connection point is collected.

Referring to FIG. 3, it is assumed that the differential mode signal of the serial connection point A is read in the first sub-period. Specifically, a voltage value relationship of the serial connection point may be controlled as C>A>B by the scanning line, and BC segment under a forward bias can be controlled to be disconnected by the pixel switch 213. Thus, the current (marked with I in the figure) can successively flow through the serial connection point A and the serial connection point C from the serial connection point B.

Further, it is assumed that the differential mode signal of the serial connection point B is read in the second sub-period. Specifically, a voltage value relationship of the serial connection point may be controlled as A>B>C by the scanning line, and AC segment under a forward bias can be controlled to be disconnected by the pixel switch 213. Thus, the current can successively flow through the serial connection point B and the serial connection point C from the serial connection point A.

Further, it is assumed that the differential mode signal of the serial connection point C is read in the third sub-period. Specifically, a voltage value relationship of the serial connection point may be controlled as B>C>A by the scanning line, and AB segment under a forward bias may be controlled to be disconnected by the pixel switch 213. Thus, the current can successively flow through the serial connection point C and the serial connection point A from the serial connection point B.

After above three sub-periods, a screen scanning process for the pixel module 210 ends.

Further, before/after/at the same time of executing S103, the signal acquisition method may also include the following steps: in the i-th sub-period, collecting the second electrical signal of the signal readout terminal 220 connected with serial connection point between the first pixel unit and a third pixel unit, wherein the third pixel unit is a pixel unit 211 other than the second pixel unit in the n pixel units 211; and collecting the second electrical signal of the signal readout terminal 220 connected with the serial connection point between the second pixel unit and a fourth pixel unit, wherein the fourth pixel unit is a pixel unit 211 other than the second pixel unit in the n pixel units 211.

Still taking the pixel module 210-1 shown in FIG. 5 for example, in the application scenario of n=3 and 1≤i≤3, assuming that the signal readout terminal 220 connected with the serial connection point A of the pixel module 210-1 is the first signal readout terminal 220, the signal readout terminal 220 connected with the serial connection point B of the pixel module 210-1 is the second signal readout terminal 220, and the signal readout terminal 220 connected with the serial connection point C of the pixel module 210-1 is the third signal readout terminal 220.

When collecting the first electrical signal of the first signal readout terminal 220, it is assumed that the first pixel unit is the pixel unit 211 on the edge formed by connecting the serial connection point C and the serial connection point A, and the second pixel unit is the pixel unit 211 on the edge formed by connecting the serial connection point B and the serial connection point A. Accordingly, the third pixel unit and the fourth pixel unit may be a same pixel unit 211, and both the serial connection point C between the third pixel unit and the first pixel unit and the serial connection point B between the fourth pixel unit and the second pixel unit are suitable for reading the second electrical signal.

Similarly, when collecting the first electrical signal of the second signal readout terminal 220, it is assumed that the first pixel unit is the pixel unit 211 on the edge formed by connecting the serial connection point B and the serial connection point A, and the second pixel unit is the pixel unit 211 on the edge formed by connecting the serial connection point B and the serial connection point C. Accordingly, the third pixel unit and the fourth pixel unit may be the pixel unit 211 on the edge formed by connecting the serial connection point A and the serial connection point C, and the serial connection point A and the serial connection point C are suitable for reading the second electrical signal.

Similarly, when collecting the first electrical signal of the third signal readout terminal 220, it is assumed that the first pixel unit is the pixel unit 211 on the edge formed by connecting the serial connection point C and the serial connection point A, and the second pixel unit is the pixel unit 211 on the edge formed by connecting the serial connection point C and the serial connection point B. Accordingly, the third pixel unit and the fourth pixel unit are the pixel unit 211 on the edge formed by connecting the serial connection point A and the serial connection point B, and the serial connection point A and the serial connection point B are suitable for reading the second electrical signal.

Further, the second electrical signal may be the common mode signal of the first pixel unit and the second pixel unit.

In other words, in some embodiment, by controlling the current to flow through any two adjacent edges of the triangle, the common mode signals of the pixel units 211 on the two adjacent edges can be respectively collected through a non-connection point of the adjacent edges.

In some embodiment, the signal acquisition period may include three sub-periods, and in each sub-period, the common mode signals of two pixel units 211 connected in series are collected.

Referring to FIG. 3, in addition to reading the differential mode signal of the serial connection point A, the common mode signals of the serial connection point B and the serial connection point C may also be read in the first sub-period.

Further, in addition to reading the differential mode signal of the serial connection point B, the common mode signals of the serial connection point A and the serial connection point C may also be read in the second sub-period.

Further, in addition to reading the differential mode signal of the serial connection point C, the common mode signals of the serial connection point A and the serial connection point B may also be read in the second sub-period.

After above three sub-periods, the screen scanning process for the pixel module 210 ends.

In some embodiment, one second electrical signal of the two aforementioned second electrical signals may be collected, and the other second electrical signal can be obtained by calculation according to collected first and second electrical signals.

Taking the second sub-period for example, an appropriate voltage is applied to the corresponding serial connection points A, B and C through the scanning lines A, B and C, so that the voltage value relationship of the three serial connection points is A>B>C. The pixel switch 213 on the edge formed by connecting the serial connection points A and B is switched on through the corresponding control line, the pixel switch 213 on the edge formed by connecting the serial connection points B and C is switched on, and the pixel switch 213 on the edge formed by connecting the serial connection points A and C is switched off, so that the current flows through the photosensitive elements 212 on the AB segment and the BC segment from the serial connection points A to B to C.

Since the differential mode signal is the difference between the electrical signal at the serial connection point A and the electrical signal at the serial connection point C, in this embodiment, only the first electrical signal at the serial connection point B and the second electrical signal at the serial connection point C can be read, and the second electrical signal at the serial connection point A can be obtained through a calculation later.

Figure 7:
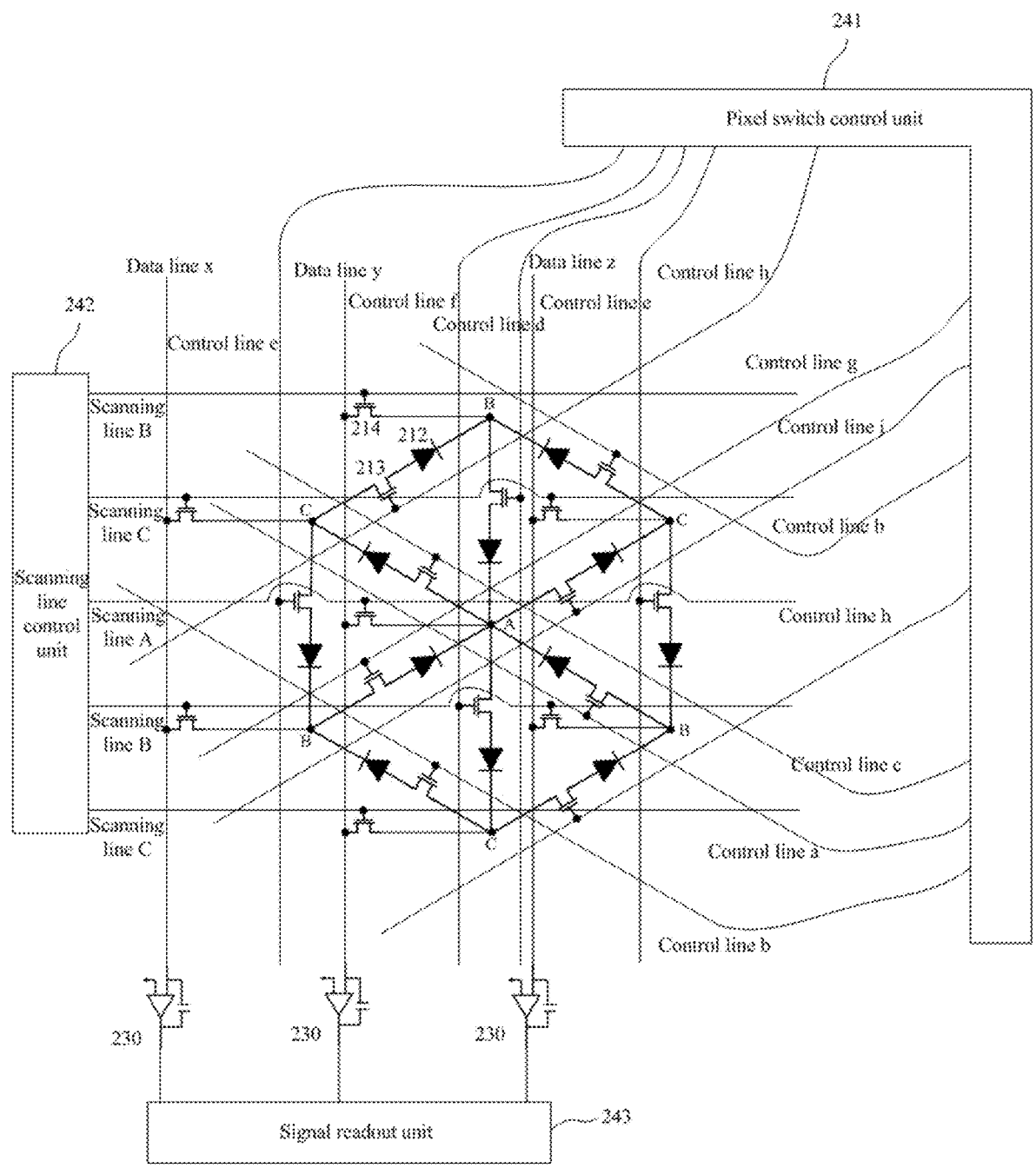
FIG. 7 is a schematic diagram of a signal acquisition circuit of the image sensor according to the first embodiment of the present disclosure.

In some embodiment, referring to FIG. 7, the signal acquisition method of the image sensor 200 shown in FIG. 6 may be performed based on a signal acquisition circuit shown in FIG. 7.

Specifically, for each pixel module 210 shown in FIGS. 2 to 5, the signal acquisition circuit sequentially collects signals from the n signal readout terminals 220 in a single signal acquisition period, wherein the signal acquisition period may include n sub-periods, and each sub-period corresponds to at least one signal readout terminal.

Further, the signal acquisition circuit may include: a pixel switch control unit 241, which controls respective pixel switches 213 of the first pixel unit and the second pixel unit to be switched on in the i-th sub-period, wherein the first pixel unit and the second pixel unit are two pixel units 211 connected with the i-th signal readout terminal 220 in the n signal readout terminals 220, and 1≤i≤n.

In some embodiment, the pixel switch control unit 241 is coupled with the plurality of control lines (the control lines a to i shown in FIG. 7) to control the first pixel unit and the second pixel unit to be switched on in each sub-period through the plurality of control lines.

Further, the signal acquisition circuit may also include: a scanning line control unit 242, which controls the current to flow through the first pixel unit and the second pixel unit in the i-th sub-period.

In some specific embodiment, the scanning line control unit 242 is coupled with the plurality of scanning lines (the scanning lines A to C shown in FIG. 7) to control the current to flow through the first pixel unit and the second pixel unit in each sub-period through the plurality of scanning lines.

Further, the signal acquisition circuit may also include: a signal readout unit 243, which collects the first electrical signal of the i-th signal readout terminal 220 in the i-th sub-period.

In some embodiment, the signal readout unit 243 may be coupled with the plurality of data lines (the data lines x to z shown in FIG. 7) to read the first electrical signals output in each sub-period through the plurality of data lines.

Further, in the i-th sub-period, the signal readout unit 243 may also collect the second electrical signal of the signal readout terminal 220 connected with the serial connection point between the first pixel unit and the third pixel unit, wherein the third pixel unit may be the pixel unit 211 other than the second pixel unit 211 in the n pixel units 211.

Further, the signal readout unit 243 may also collect the second electrical signal of the signal readout terminal 220 connected with the serial connection point between the second pixel unit and the fourth pixel unit, wherein the fourth pixel unit may be the pixel unit 211 other than the second pixel unit 211 in the n pixel units 211.

In some embodiment, for each serial connection point, the serial connection point is connected with a corresponding power line (not shown in the figures) through a switch module (not shown in the figure). The power line is suitable for applying an appropriate voltage to the connected serial connection point so as to control the flow direction of the current on the switched-on pixel unit 211.

In a typical application scenario, referring to FIGS. 2 to 8, the complete scanning process of the six pixel modules 210 shown in FIGS. 5 and 7 may include three phases, which are respectively recorded as phase 1, suitable for reading the differential mode signal of the serial connection point A, phase 2, suitable for reading the differential mode signal of the serial connection point B, and phase 3, suitable for reading the differential mode signal of the serial connection point C.

Figure 8:
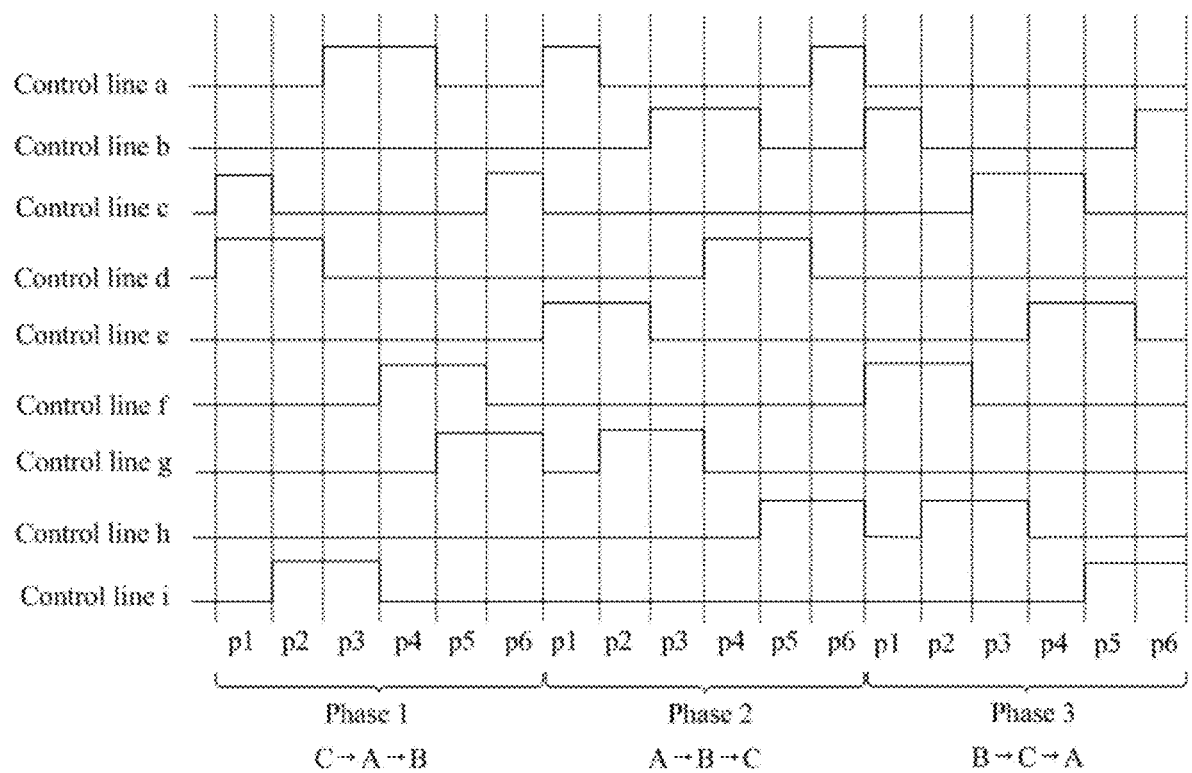
FIG. 8 is a timing diagram of a pixel switch control unit in FIG. 7 in a single signal acquisition period.

For each phase, each phase may include six sub-phases (marked with p1 to p6 in FIG. 8). The six sub-phases are suitable for reading the differential mode signals of all pixel modules 210 sharing the same serial connection point at the same serial connection point, so as to further reduce the complexity of signal control of the scanning line control unit 242 and the signal readout unit 243.

In other words, for the same pixel module 210, each of the phases 1, 2, and 3 shown in FIG. 8 corresponds to a sub-period, and p1 of phase 1, p1 of phase 2, and p1 of phase 3 may correspond to the aforementioned single signal acquisition period.

In some embodiment, the number of the sub-phases in each phase may be associated with the number of the pixel modules 210 connected with the serial connection point of which the differential mode signal needs to be read in this phase.

Taking phase 1 for example, the differential mode signal of the serial connection point A shown in FIG. 7 needs to be read in phase 1. Since the serial connection point A may be shared by at most six pixel modules 210 when n=3, the number of the sub-phases in phase 1 is 6.

In the sub-phase p1 of phase 1, the control line c and the control line d are applied with a high potential, and the remaining control lines are at a low potential. With the cooperation of the scanning lines A, B and C and the power lines, the AC segment and the AB segment of the pixel module 210-1 are switched on, and the current flows from the serial connection point C to the serial connection point A to the serial connection point B of the pixel module 210-1. At this time, by switching on the appropriate scanning lines, the differential mode signals of the pixel unit 211 on the AC segment and the pixel unit 211 on the AB segment of the pixel module 210 at the serial connection point A of the pixel module 210-1 may be read through the data line y.

Further, in the sub-phase p1, the common mode signals of the pixel unit 211 on the AC segment and the pixel unit 211 on the AB segment of the pixel module 210-1 at the serial connection point B may also be read through the data line y in a time dividing manner.

Further, in the sub-phase p1, the common mode signals of the pixel unit 211 on the AC segment and the pixel unit 211 on the AB segment of the pixel module 210-1 at the serial connection point C may also be read through the data line x.

In the sub-phase p2 of phase 1, the control line d and the control line i are applied with a high potential, and the remaining control lines are at a low potential. With the cooperation of the scanning lines A, B and C, the AC segment and the AB segment of the pixel module 210-2 are switched on, and the current flows from the serial connection point C to the serial connection point A to the serial connection point B of the pixel module 210-2. At this time, the differential mode signals of the pixel unit 211 on the AC segment and the pixel unit 211 on the AB segment of the pixel module 210-2 at the serial connection point A may be read through the data line y.

Further, in the sub-phase p2, the common mode signals of the pixel unit 211 on the AC segment and the pixel unit 211 on the AB segment of the pixel module 210-2 at the serial connection point B may also be read through the data line y in a time dividing manner.

Further, in the sub-phase p2, the common mode signals of the pixel unit 211 on the AC segment and the pixel unit 211 on the AB segment of the pixel module 210-2 at the serial connection point C may also be read through the data line z.

In the sub-phase p3 of phase 1, the control line a and the control line i are applied with a high potential, and the remaining control lines are at a low potential. With the cooperation of the scanning lines A, B and C, the AC segment and the AB segment of the pixel module 210-3 are switched on, and the current flows from the serial connection point C to the serial connection point A to the serial connection point B of the pixel module 210-3. At this time, the differential mode signals of the pixel unit 211 on the AC segment and the pixel unit 211 on the AB segment of the pixel module 210-3 at the serial connection point A may be read through the data line y.

Further, in the sub-phase p3, the common mode signals of the pixel unit 211 on the AC segment and the pixel unit 211 on the AB segment of the pixel module 210-3 at the serial connection point B may also be read through the data line z.

Further, in the sub-phase p3, the common mode signals of the pixel unit 211 on the AC segment and the pixel unit 211 on the AB segment of the pixel module 210-3 at the serial connection point C may also be read through the data line z in a time dividing manner.

In the sub-phase p4 of phase 1, the control line a and the control line f are applied with a high potential, and the remaining control lines are at a low potential. With the cooperation of the scanning lines A, B and C, the AC segment and the AB segment of the pixel module 210-4 are switched on, and the current flows in a sequence from the serial connection point C to the serial connection point A to the serial connection point B of the pixel module 210-4. At this time, the differential mode signals of the pixel unit 211 on the AC segment and the pixel unit 211 on the AB segment of the pixel module 210-4 at the serial connection point A may be read through the data line y.

Further, in the sub-period p4, the common mode signals of the pixel unit 211 on the AC segment and the pixel unit 211 on the AB segment of the pixel module 210-4 at the serial connection point B may also be read through the data line z.

Further, in the sub-period p4, the common mode signals of the pixel unit 211 on the AC segment and the pixel unit 211 on the AB segment of the pixel module 210-4 at the serial connection point C may also be read through the data line y in a time dividing manner.

In the sub-period p5 of phase 1, the control line f and the control line g are applied with a high potential, and the remaining control lines are at a low potential. With the cooperation of the scanning lines A, B and C, the AC segment and the AB segment of the pixel module 210-5 are switched on, and the current flows in a sequence from the serial connection point C to the serial connection point A to the serial connection point B of the pixel module 210-5. At this time, the differential mode signals of the pixel unit 211 on the AC segment and the pixel unit 211 on the AB segment of the pixel module 210-5 at the serial connection point A may be read through the data line y.

Further, in the sub-phase p5, the common mode signals of the pixel unit 211 on the AC segment and the pixel unit 211 on the AB segment of the pixel module 210-5 at the serial connection point B may also be read through the data line x.

Further, in the sub-phase p5, the common mode signals of the pixel unit 211 on the AC segment and the pixel unit 211 on the AB segment of the pixel module 210-5 at the serial connection point C may also be read by the data line y in a time dividing manner.

In the sub-phase p6 of phase 1, the control line g and the control line c are applied with a high potential, and the remaining control lines are at a low potential. With the cooperation of the scanning lines A, B and C, the AC segment and the AB segment of the pixel module 210-6 are switched on, and the current flows in a sequence from the serial connection point C to the serial connection point A to the serial connection point B of the pixel module 210-6. At this time, the differential mode signals of the pixel unit 211 on the AC segment and the pixel unit 211 on the AB segment of the pixel module 210-6 at the serial connection point A may be read through the data line y.

Further, in the sub-phase p6, the common mode signals of the pixel unit 211 on the AC segment and the pixel unit 211 on the AB segment of the pixel module 210-6 at the serial connection point B may also be read through the data line x.

Further, in the sub-phase p6, the common mode signals of the pixel unit 211 on the AC segment and the pixel unit 211 on the AB segment of the pixel module 210-6 at the serial connection point C may also be read through the data line x in a time dividing manner.

Accordingly, for the pixel module 210 at an edge of the image sensor 200, the serial connection point of the pixel module 210 may be shared by at most three pixel modules 210. At this time, the corresponding phase may include three sub-phases.

As above, the solution of the embodiment can use the compatibility in the process, so that the plurality of pixel units 211 may be connected in series, thus the differential mode signal and the common mode signal may be read independently in a single signal acquisition period, which is beneficial to obtain the complete signal of the pixel unit 211.

Specifically, each serial connection point is connected with a signal readout terminal 220, so that the differential mode signal between two pixel units 211 connected in series through the corresponding serial connection point may be read at the signal readout terminal 220, and at the same time, the common mode signal of the two pixel units 211 may be read at the signal readout terminal 220 connected with the serial connection point between the two pixel units 211 and other pixel units 211 other than the two pixel units 211.

Furthermore, the design of the closed-loop structure enables the differential mode signal of each pixel unit 211 of the n pixel units 211 to be extracted from the complete signal to obtain independent acquisition.

Furthermore, two adjacent pixel modules 210 share the same pixel unit 211 and the signal readout terminals 220 connected with the first terminal 211a and the second terminal 211b of the same pixel unit 211, which is beneficial to obtain a more compact device arrangement and achieve the effect of reducing cost.

Furthermore, such a device arrangement is also conducive to minimizing the number of the control lines, data lines and scanning lines, and reducing the wiring complexity in the image sensor 200.

Figure 9:
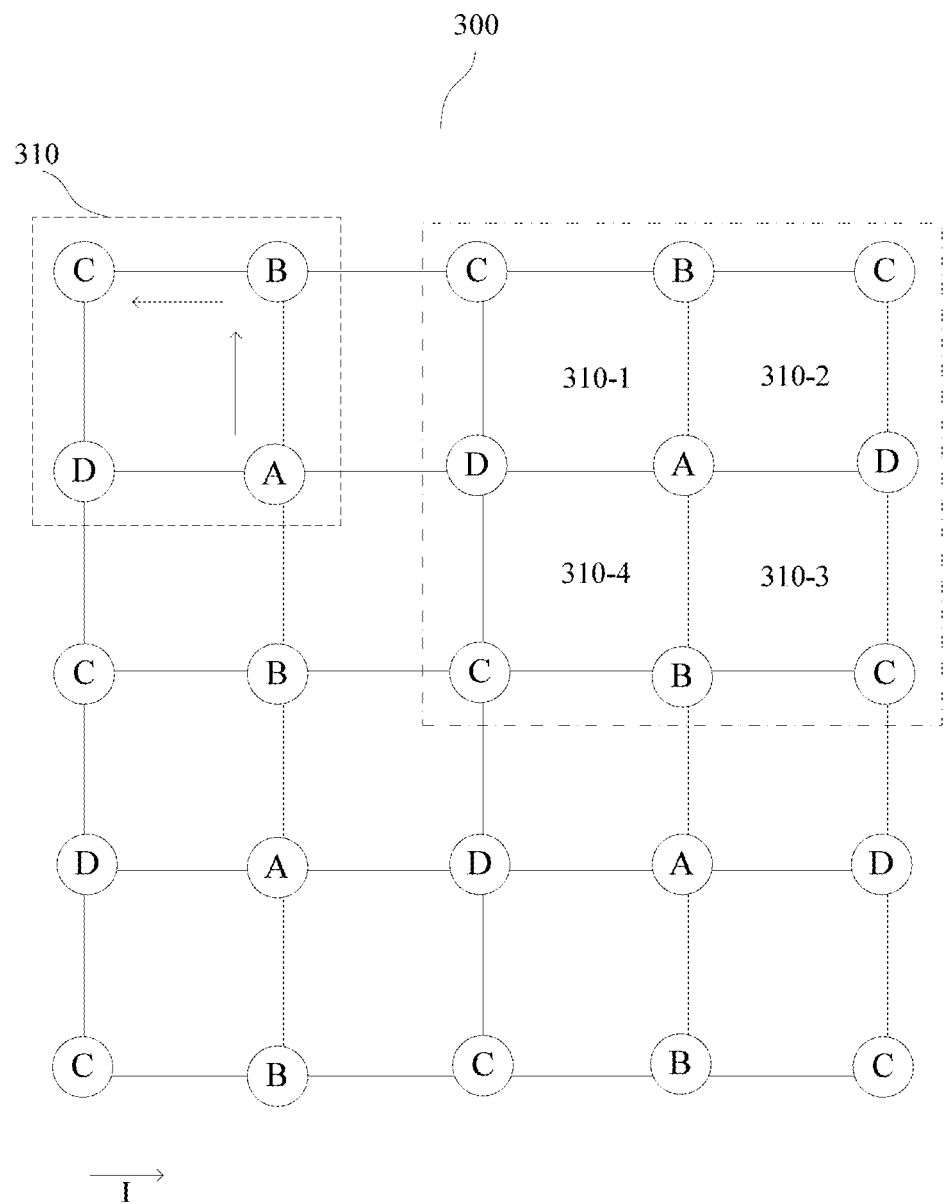
FIG. 9 is a schematic diagram of an image sensor according to a second embodiment of the present disclosure.
Figure 10:
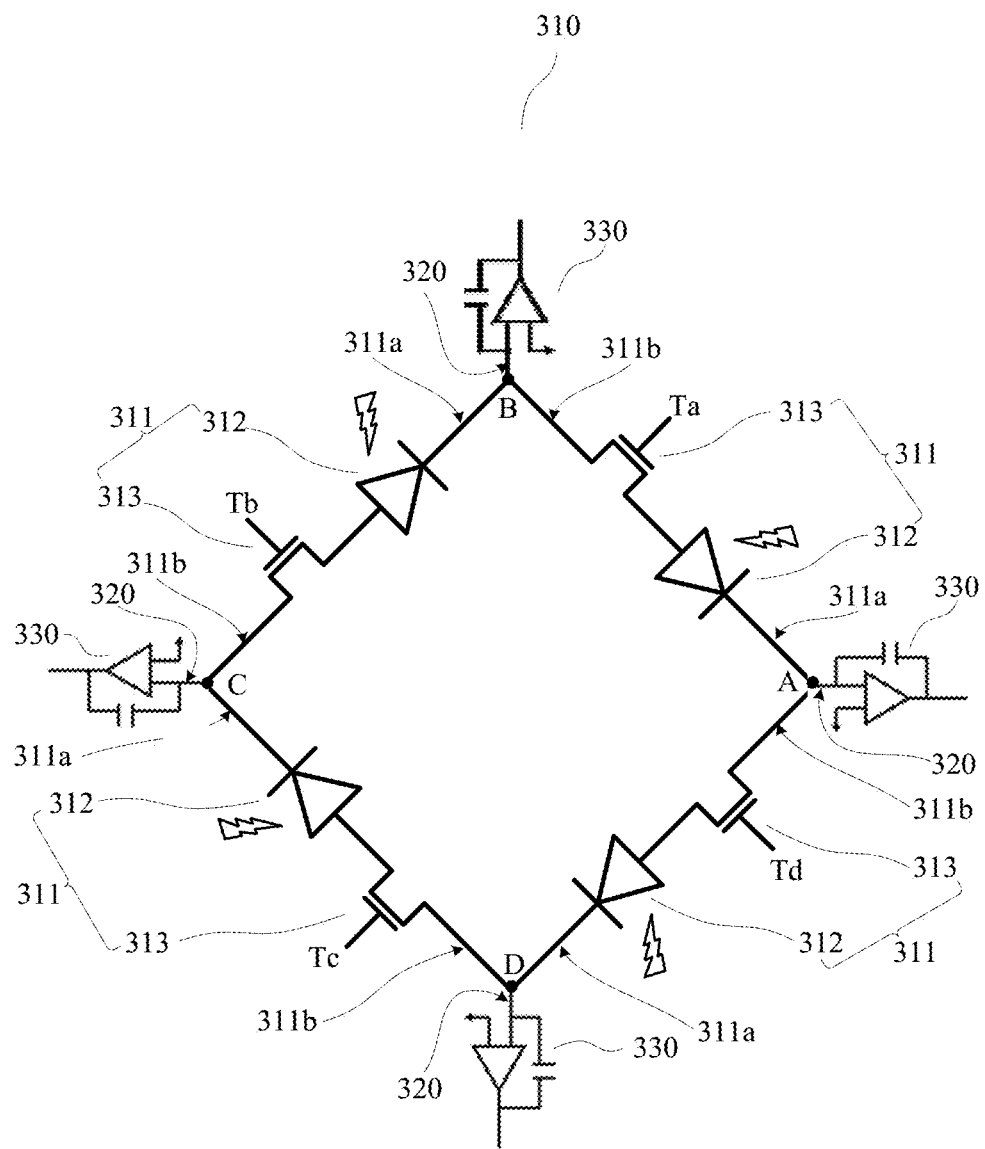
FIG. 10 is a schematic diagram of a single pixel module in the embodiment shown in FIG. 9.
Figure 11:
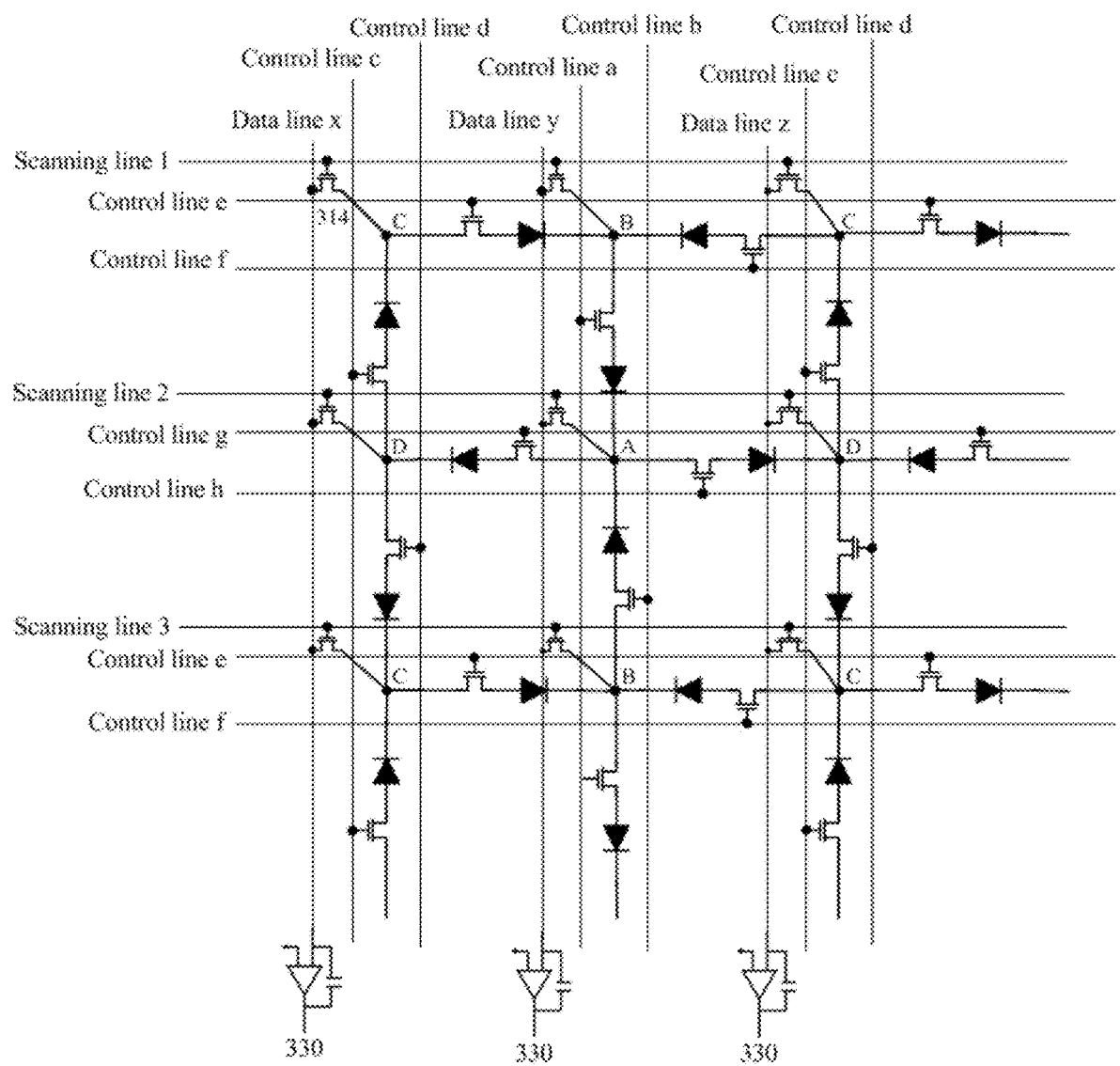
FIG. 11 is a schematic diagram of a circuit connection of a plurality of pixel modules in the embodiment shown in FIG. 9.
Figure 12:
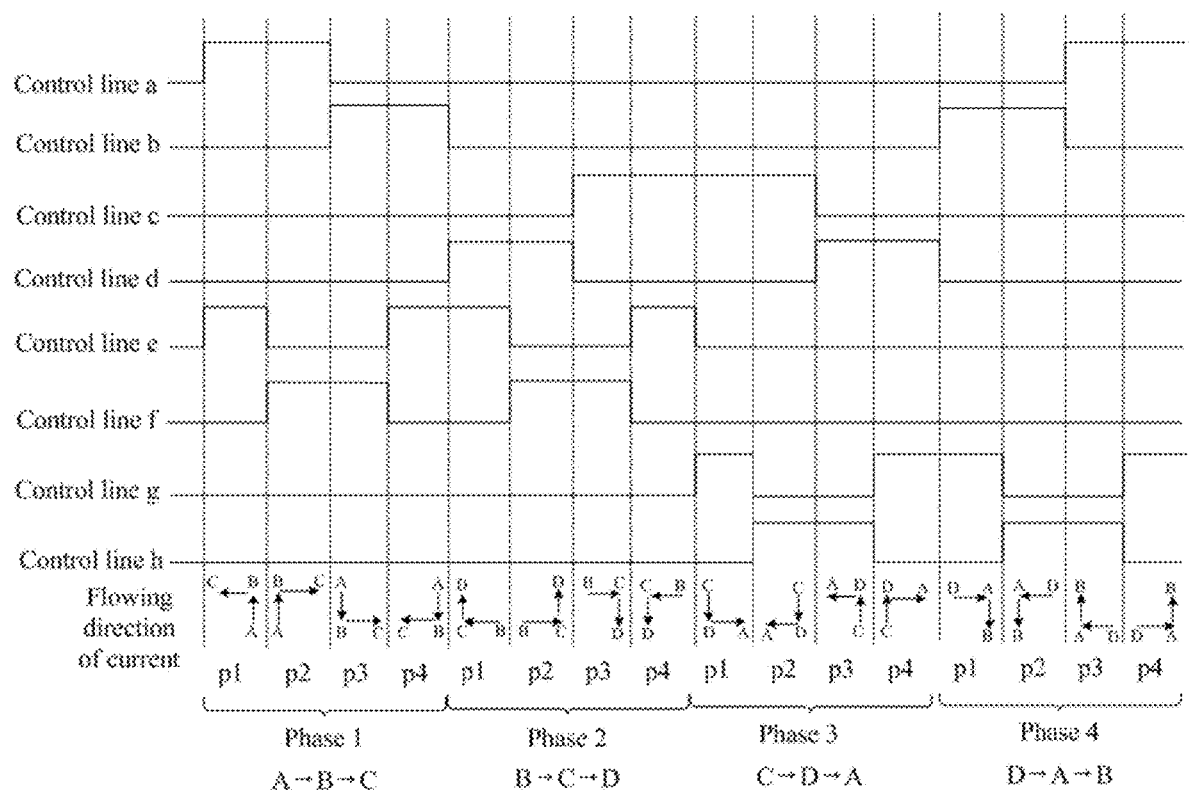
FIG. 12 is a timing diagram of a pixel switch control unit in the embodiment shown in FIG. 9 in a single complete scanning process.
Figure 13:
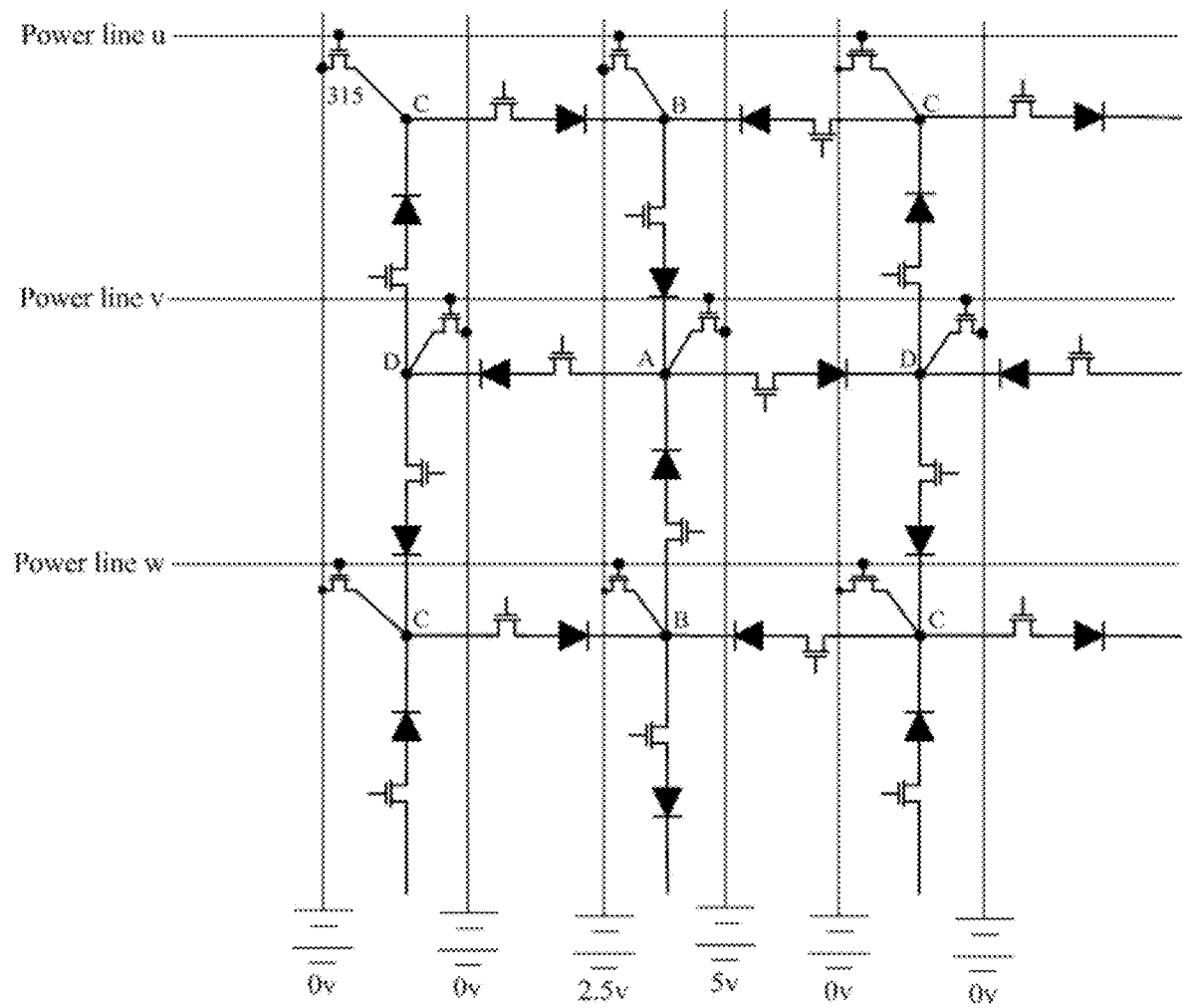
FIG. 13 is a schematic diagram of a power line connection of a plurality of pixel modules in the embodiment shown in FIG. 9.

FIG. 9 is a schematic diagram of an image sensor according to a second embodiment of the present disclosure; FIG. 10 is a schematic diagram of a single pixel module in the embodiment shown in FIG. 9; FIG. 11 is a schematic diagram of a circuit connection of a plurality of pixel modules in the embodiment shown in FIG. 9; FIG. 12 is a timing diagram of a pixel switch control unit in the embodiment shown in FIG. 9 in a single complete scanning process; and FIG. 13 is a schematic diagram of a power line connection of a plurality of pixel modules in the embodiment shown in FIG. 9.

Next, only the differences between the second embodiment and the first embodiment shown in FIGS. 3 to 8 above will be described in detail.

Specifically, in this embodiment, an image sensor 300 may include a plurality of pixel modules 310. Each pixel module 310 may include: four pixel units 311 connected in series to form a closed-loop structure, wherein each pixel unit 311 has a first terminal 311a and a second terminal 311b, and each pixel unit 311 includes a photosensitive element 312 and a pixel switch 313 connected in series; four signal readout terminals 320, wherein each serial connection point (marked with A, B, C and D in the figure) between each pixel unit 311 and the other pixel units 311 is connected with a corresponding signal readout terminal 320, wherein two adjacent pixel modules 310 share a same pixel unit 311 and the signal readout terminals 320 connected with the first terminal 311a and the second terminal 311b of the same pixel unit 311.

More specifically, each signal readout terminal 320 may be connected with an external amplifier 330 to collect the signals collected by the corresponding pixel unit 311.

In some embodiment, n=4, and each pixel module 310 can form a quadrilateral structure as shown in FIG. 9.

In some embodiment, the number of the pixel modules 310 may be 16, as shown in FIG. 9. In practical application, those skilled in the art may also adjust the specific number of the pixel module 310 as required.

In order to clearly show the wiring design in FIG. 11, referring to FIG. 9 and FIG. 11, the four pixel modules 310 shown in FIG. 9 are numbered as pixel modules 310-1 to 310-4 in a clockwise direction starting from an upper left corner.

In some embodiment, referring to FIG. 11, the image sensor 300 may also include: a plurality of control lines (marked with a-h in the figure). In a same pixel module 310, control terminals of different pixel switches 313 (marked with Ta, Tb, Tc and Td in FIG. 4) are connected with different control lines to ensure that the four pixel switches 313 will not be switched on at the same time in a single signal acquisition period.

Taking the pixel module 310-1 for example, referring to FIG. 11, the pixel module 310-1 includes four pixel units 311 connected in series to form a quadrilateral, and four vertices of the quadrilateral are serial connection points A, B, C and D between two adjacent pixel units 411 connected in series. The control terminal (corresponding to the control terminal Tb shown in FIG. 10) of the pixel switch 313 on an edge formed by connecting the serial connection point B and the serial connection point C is connected with a control line e, the control terminal (corresponding to the control terminal Ta shown in FIG. 10) of the pixel switch 313 on an edge formed by connecting the serial connection point B and the serial connection point A is connected with a control line a, the control terminal (corresponding to the control terminal Td shown in FIG. 10) of the pixel switch 313 on an edge formed by connecting the serial connection point A and the serial connection point D is connected with a control line g, and the control terminal (corresponding to the control terminal Tc shown in FIG. 10) of the pixel switch 313 on an edge formed by connecting the serial connection point D and the serial connection point C is connected with a control line c.

Taking the pixel module 310-2 for example, the pixel module 310-2 and the pixel module 310-1 share the serial connection point B, the serial connection point A, and the pixel unit 311 on the edge formed by connecting the serial connection point B and the serial connection point A. Further, the control terminal of the pixel switch 313 on the edge formed by connecting the serial connection point B and the serial connection point C of the pixel module 310-2 is connected with a control line f, the control terminal of the pixel switch 313 on the edge formed by connecting the serial connection point C and the serial connection point D of the pixel module 310-2 is connected with the control line c, and the control terminal of the pixel switch 313 on the edge formed by connecting the serial connection point A and the serial connection point D of the pixel module 310-2 is connected with a control line h.

Taking the pixel module 310-3 for example, the pixel module 310-3 and the pixel module 310-2 share the serial connection point D, the serial connection point A, and the pixel unit 311 on the edge formed by connecting the serial connection point D and the serial connection point A. Further, the control terminal of the pixel switch 313 on the edge formed by connecting the serial connection point D and the serial connection point C of the pixel module 310-3 is connected with a control line d, the control terminal of the pixel switch 313 on the edge formed by connecting the serial connection point C and the serial connection point B of the pixel module 310-3 is connected with the control line f, and the control terminal of the pixel switch 313 on the edge formed by connecting the serial connection point B and the serial connection point A of the pixel module 310-3 is connected with a control line b.

Taking the pixel module 310-4 for example, the pixel module 310-4 and the pixel module 310-3 share the serial connection point B, the serial connection point A, and the pixel unit 311 on the edge formed by connecting the serial connection point B and the serial connection point A.

Further, the control terminal of the pixel switch 313 on the edge formed by connecting the serial connection point B and the serial connection point C of the pixel module 310-4 is connected with the control line e, the control terminal of the pixel switch 313 on the edge formed by connecting the serial connection point C and the serial connection point D of the pixel module 310-4 is connected with the control line d, and the control terminal of the pixel switch 313 on the edge formed by connecting the serial connection point A and the serial connection point D of the pixel module 310-4 is connected with the control line g.

In other words, in the application scenario of n=4, taking any serial connection point of the pixel module 310 as a center point, a most compact arrangement structure shown in FIG. 11 can be obtained. The arrangement structure is a quadrilateral structure composed of four pixel modules 310, in which all pixel modules 310 share a same serial connection point, and the remaining three serial connection points of one pixel module 310 are respectively shared by the one pixel module 310 and other three pixel modules 310.

In order to ensure that the differential mode signal of each serial connection point can be accurately measured, it can be seen from FIG. 11 that respective pixel switches 313 of the adjacent pixel units 311 in any row or in any column are respectively connected with different control lines according to an angle shown in the figure. The row and column are respectively parallel to two perpendicular edges of the quadrilateral.

Further, in order to minimize the number of the control lines, some pixel modules 310 may share a control line.

In some embodiment, respective pixel switches 313 of the pixel units 311 in the row or column separated from each other may be connected with a same control line.

For example, referring to FIG. 11, the pixel switch 313 on the BC segment of the pixel module 310-2 and the pixel switch 313 on the BC segment of the pixel module 310-3 can share the control line f, the pixel switch 313 on the BC segment of the pixel module 310-1 and the pixel switch 313 on the BC segment of the pixel module 310-4 can share the control line e, the pixel switch 313 on the CD segment of the pixel module 310-2 and the pixel switch 313 on the CD segment of the pixel module 310-1 can share the control line c, and the pixel switch 313 on the CD segment of the pixel module 310-3 and the pixel switch 313 on the CD segment of the pixel module 310-4 can share the control line d.

In some embodiment, the signal readout terminals 320 respectively connected with four serial connection points of the same pixel module 310 are connected with at least two data lines.

Taking the pixel module 310-1 for example, referring to FIG. 11, the signal readout terminals 320 respectively connected with the serial connection point C and the serial connection point D of the pixel module 310-1 are connected with a data line x, and the signal readout terminals 320 respectively connected with the serial connection point B and the serial connection point A of the pixel module 310-1 are connected with a data line y.

Taking the pixel module 310-2 for example, referring to FIG. 11, the signal readout terminals 320 respectively connected with the serial connection point C and the serial connection point D of the pixel module 310-2 are connected with a data line z.

Taking the pixel module 310-3 for example, referring to FIG. 11, the signal readout terminal 320 connected with the serial connection point C of the pixel module 310-3 is connected with the data line z, and the signal readout terminal 320 connected with the serial connection point B of the pixel module 310-3 is connected with the data line y.

Taking the pixel module 310-4 for example, referring to FIG. 11, the signal readout terminal 320 connected with the serial connection point C of the pixel module 310-4 is connected with the data line x.

In some embodiment, in order to reduce the number of wirings, some pixel modules 310 may share a data line.

For example, referring to FIG. 11, the serial connection points in the same column may be connected with a same data line.

In some embodiment, each signal readout terminal 320 may be connected with the corresponding data line through a switch module 314.

In some embodiment, referring to FIG. 11, the serial connection points in the same row may be connected with a same scanning line (marked with 1, 2 and 3 in the figure).

In some embodiment, the control lines a to h may also be connected with a pixel switch control unit, the scanning lines 1 to 3 may also be connected with a scanning line control unit, and the data lines x to z may also be connected with the signal readout unit 243.

In some embodiment, for each serial connection point, the serial connection point is connected with a corresponding power line (marked with u, v and w in the figure) and a voltage source (example of 0V, 2.5V and 5V in the figure) through a switch module 315. The power line and the voltage source are suitable for applying an appropriate voltage to the connected serial connection point to control the flowing direction of the current on the switched-on pixel unit 311.

In a typical application scenario, referring to FIG. 12, a complete scanning process of the four pixel modules 310 shown in FIGS. 9 to 11 may include four phases, which are respectively recorded as phase 1, suitable for reading a differential mode signal of the serial connection point B; phase 2, suitable for reading a differential mode signal of the serial connection point C; phase 3, suitable for reading a differential mode signal of the serial connection point D; and phase 4, suitable for reading a differential mode signal of the serial connection point A.

Each phase may include four sub-phases (marked with p1 to p4 in FIG. 12), and the four sub-phases are suitable for reading the differential mode signals of all pixel modules 310 sharing a same serial connection point at the serial connection point.

In other words, for the same pixel module 310, each of phases 1, 2, 3 and 4 shown in FIG. 12 corresponds to a sub-period, and p1 of phase 1, p1 of phase 2, p1 of phase 3 and p1 of phase 4 correspond to the aforementioned single signal acquisition period.

Taking phase 1 for example, the differential mode signal of the serial connection point B shown in FIG. 11 needs to be read in phase 1.

In the sub-phase p1 of phase 1, in combination with FIG. 13, with the cooperation of the power lines u to w and the scanning lines 1 to 3, voltage values of the four serial connection points of the pixel module 310-1 are set as A>B>C=D. The serial connection points C and D are applied with a voltage of 0V, the serial connection point B is applied with a voltage of 2.5V, and the serial connection point A is applied with a voltage of 5V. Further, the control line a and the control line e are applied with a high potential, and the remaining control lines are at a low potential, so that AD segment under a forward bias and CD segment which does not need to be switched on at this phase are in an off state. At this time, BC segment and AB segment of the pixel module 310-1 are switched on, and a current flows in a sequence from the serial connection point A to the serial connection point B to the serial connection point C of the pixel module 310-1. At this time, the differential mode signals of the pixel unit 311 on the BC segment and the pixel unit 311 on the AB segment of the pixel module 310-1 at the serial connection point B may be read through the data line y.

Further, in the sub-phase p1, the common mode signals of the pixel unit 311 on the BC segment and the pixel unit 311 on the AB segment of the pixel module 310-1 at the serial connection point C may also be read through the data line x.

Further, in the sub-phase p1, the common mode signals of the pixel unit 311 on the BC segment and the pixel unit 311 on the AB segment of the pixel module 310-1 at the serial connection point A may also be read through the data line y in a time dividing manner.

Further, in each sub-phase, half of the scanning lines may be switched on one by one, and the half of the scanning lines that are switched on are switched on in interlacing columns. After the half of the scanning lines are switched on, the next sub-phase is started for repetition.

For example, in the sub-phase p1, the scanning line 1 is first switched on to read the differential mode signals of the pixel unit 311 on the BC segment and the pixel unit 311 on the AB segment of the pixel module 310-1 at the serial connection point B and the common mode signals of the pixel unit 311 on the BC segment and the pixel unit 311 on the AB segment of the pixel module 310-1 at the serial connection point C.

Then, the scanning line 3 and a suitable power line is switched on to read the differential mode signals of the pixel unit 311 on the BC segment and the pixel unit 311 on the AB segment of the pixel module 310 in next row and in the same column of the pixel module 310-3 at the serial connection point B, and the common mode signals of the two pixel units at the serial connection point C.

That is, in the wiring manner shown in FIG. 12, in the sub-phase p1, only the scanning lines in the odd row are switched on to read the corresponding signals.

In the sub-phase p2 of phase 1, the control line a and the control line f are applied with a high potential, and the remaining control lines are at a low potential. With the cooperation of the scanning lines 1 to 3 and the power lines u to w, the BC segment and the AB segment of the pixel module 310-2 are switched on, and the current flows in a sequence from the serial connection point A to the serial connection point B to the serial connection point C of the pixel module 310-2. At this time, the differential mode signals of the pixel unit 311 on the BC segment and the pixel unit 311 on the AB segment of the pixel module 310-2 at the serial connection point B may be read through the data line y.

Further, in the sub-phase p2, the common mode signals of the pixel unit 311 on the BC segment and the pixel unit 311 on the AB segment of the pixel module 310-2 at the serial connection point C may also be read through the data line z.

Further, in the sub-phase p2, the common mode signals of the pixel unit 311 on the BC segment and the pixel unit 311 on the AB segment of the pixel module 310-2 at the serial connection point A may also be read through the data line y in a time dividing manner.

In the sub-phase p3 of phase 1, the control line b and the control line f are applied with a high potential, and the remaining control lines are at a low potential. With the cooperation of the power lines u to w and the scanning lines 1 to 3, the BC segment and the AB segment of the pixel module 310-3 are switched on, and the current flows in a sequence from the serial connection point A to the serial connection point B to the serial connection point C of the pixel module 310-3. At this time, the differential mode signals of the pixel unit 311 on the BC segment and the pixel unit 311 on the AB segment of the pixel module 310-3 at the serial connection point B may be read through the data line y.

Further, in the sub-phase p3, the common mode signals of the pixel unit 311 on the BC segment and the pixel unit 311 on the AB segment of the pixel module 310-3 at the serial connection point C may also be read through the data line z.

Further, in the sub-phase p3, the common mode signals of the pixel unit 311 on the BC segment and the pixel unit 311 on the AB segment of the pixel module 310-3 at the serial connection point A may also be read through the data line y in a time dividing manner.

In the sub-phase p4 of phase 1, the control line b and the control line e are applied with a high potential, and the remaining control lines are at a low potential. With the cooperation of the power lines u to w and the scanning lines 1 to 3, the BC segment and the AB segment of the pixel module 310-4 are switched on, and the current flows in a sequence from the serial connection point A to the serial connection point B to the serial connection point C of the pixel module 310-4. At this time, the differential mode signals of the pixel unit 311 on the BC segment and the pixel unit 311 on the AB segment of the pixel module 310-4 at the serial connection point B may be read through the data line y.

Further, in the sub-phase p4, the common mode signals of the pixel unit 311 on the BC segment and the pixel unit 311 on the AB segment of the pixel module 310-4 at the serial connection point C may also be read through the data line x.

Further, in the sub-phase p4, the common mode signals of the pixel unit 311 on the BC segment and the pixel unit 311 on the AB segment of the pixel module 310-4 at the serial connection point A may also be read through the data line y in a time dividing manner.

Accordingly, for the pixel module 310 at an edge of the image sensor 300, the serial connection point of the pixel module 310 may be shared by at most two pixel modules 310. At this time, the corresponding phase may include two sub-phases.

In a variation of the present embodiment, the data line x and the data line z may be connected with the same external amplifier 330.

Figure 14:
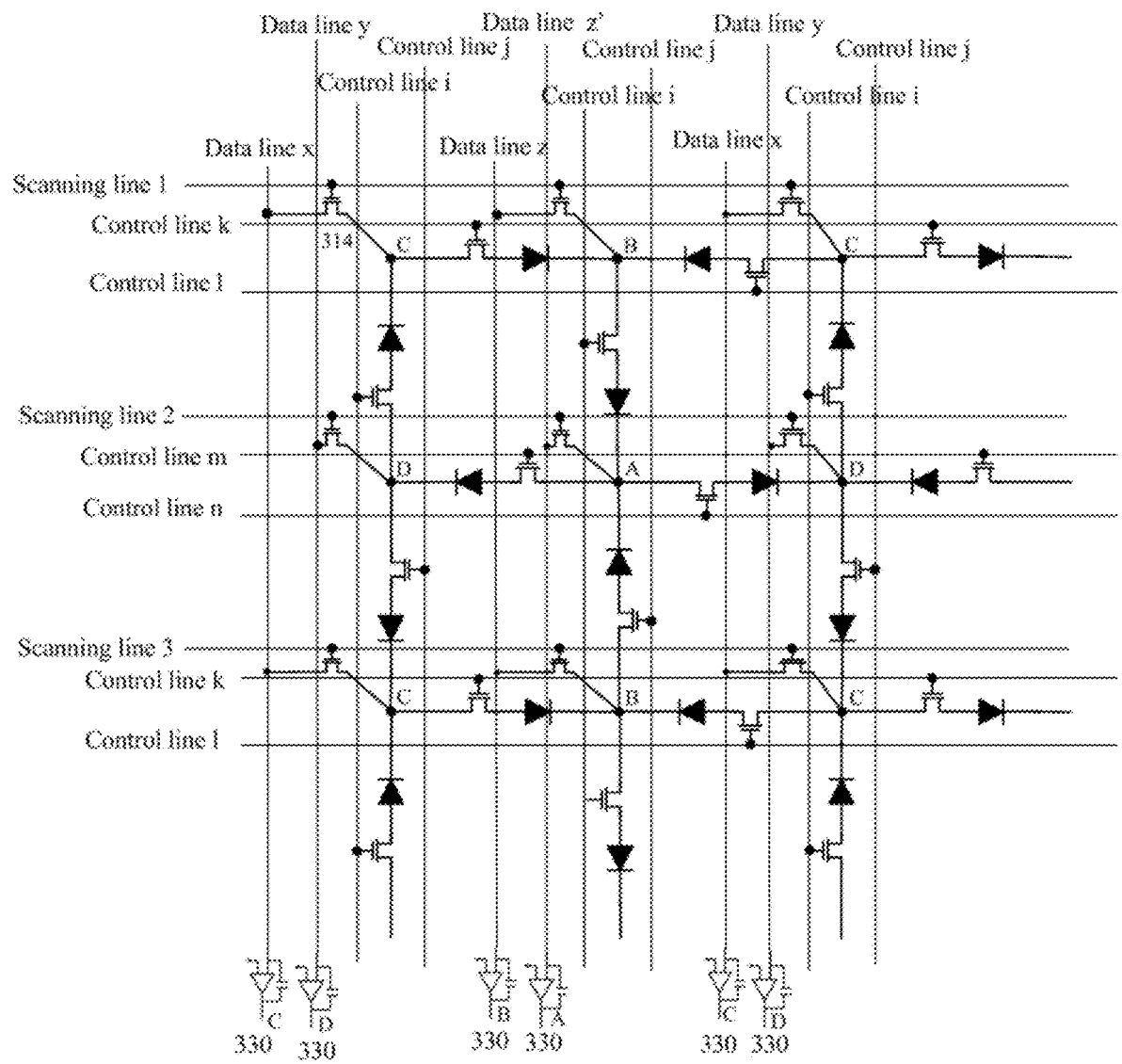
FIG. 14 is a schematic diagram of a circuit connection of an image sensor according to a third embodiment of the present disclosure.
Figure 15:
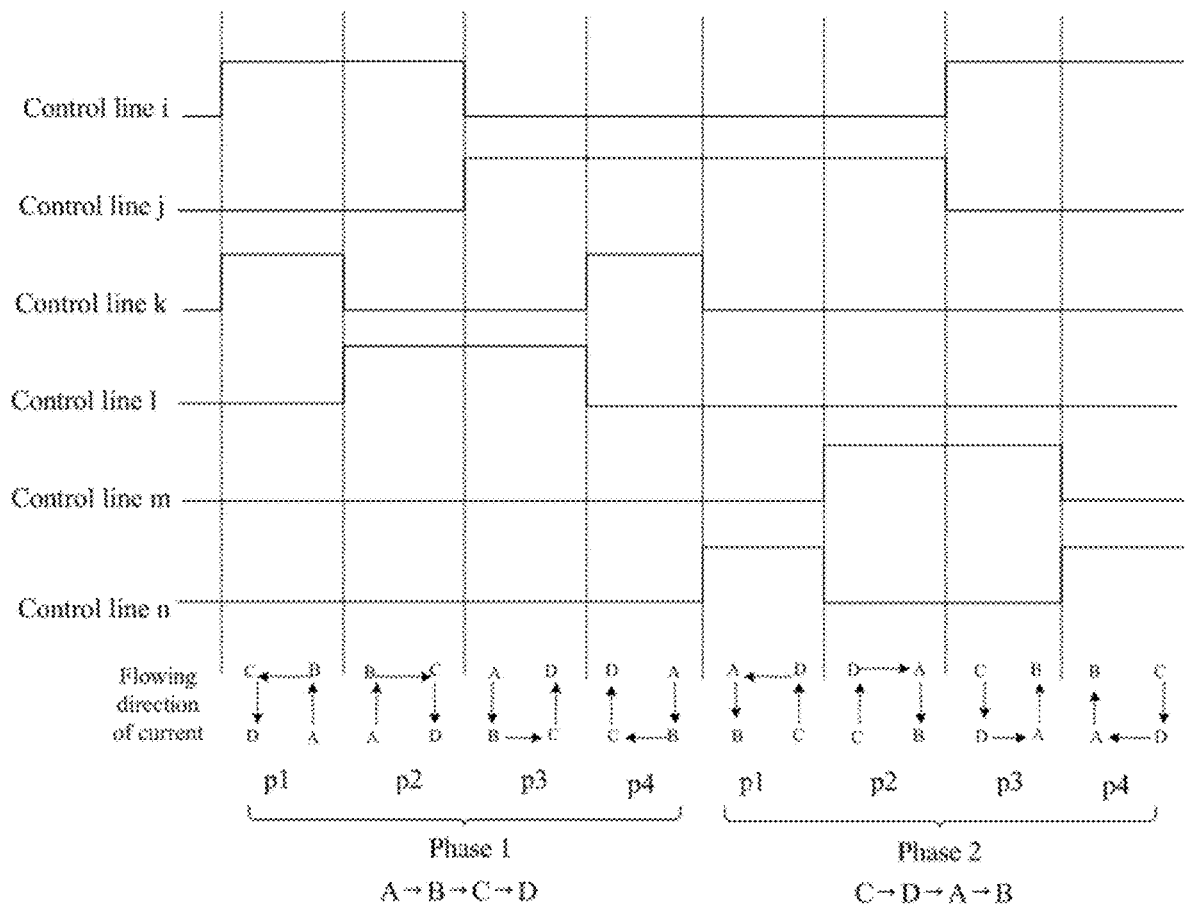
FIG. 15 is a timing diagram of a pixel switch control unit in the embodiment shown in FIG. 14 in a single complete scanning process.
Figure 16:
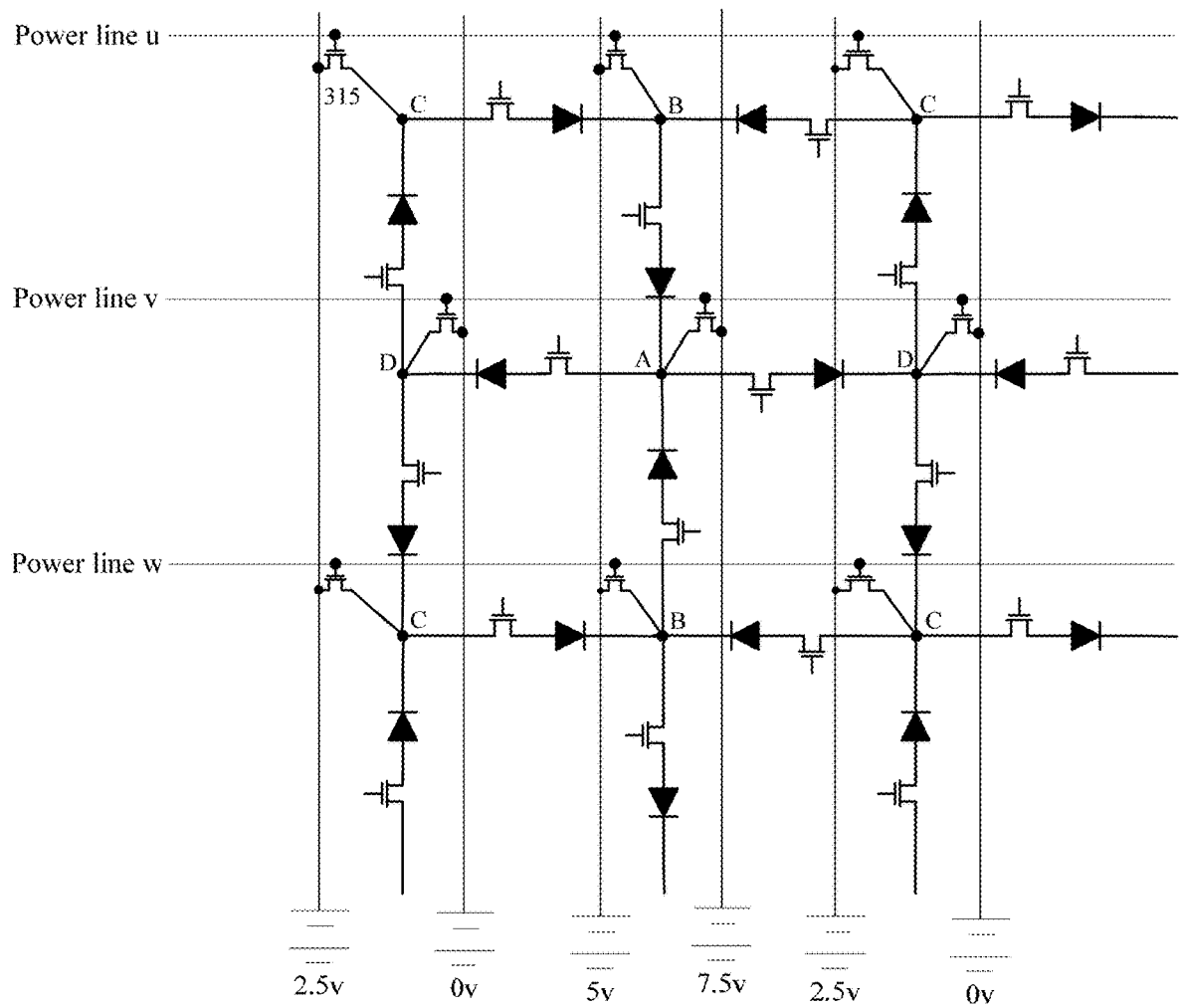
FIG. 16 is a schematic diagram of a power line connection of a plurality of pixel modules in the embodiment shown in FIG. 14.

FIG. 14 is a schematic diagram of a circuit connection of an image sensor according to a third embodiment of the present disclosure, FIG. 15 is a timing diagram of a pixel switch control unit in the embodiment shown in FIG. 14 in a single complete scanning process, and FIG. 16 is a schematic diagram of a power line connection of a plurality of pixel modules in the embodiment shown in FIG. 14.

Next, the differences between the third embodiment and the second embodiment shown in FIGS. 9 to 13 above will be described in detail.

In some embodiment, each sub-period may correspond to x signal readout terminals 320, and $2 \leq x < n$.

In the application scenario of n=4, x=2.

Accordingly, in the i-th sub-period, the pixel switch control unit can control respective pixel switches 313 of x+1 pixel units 311 connected in series in the n pixel units 311 to be switched on, the scanning line control unit can control the current to flow through the x+1 pixel units 311, and the signal readout unit 243 can collect the first electrical signals of the x signal readout terminals 320, respectively. The serial connection points between adjacent pixel units in the x+1 pixel units 311 are respectively connected with the x signal readout terminals 320.

Further, in the i-th sub-period, the signal readout unit 243 may also collect the second electrical signal of the signal readout terminal 320 connected with the serial connection point between a first pixel unit 311 and a third pixel unit in the x+1 pixel units 311, wherein the third pixel unit is the pixel unit 311 other than the x+1 pixel units 311 in the n pixel units 311.

Further, in the i-th sub-period, the signal readout unit 243 may also collect the second electrical signal of the signal readout terminal 320 connected with the serial connection point between a last pixel unit 311 and a fourth pixel unit 311 in the x+1 pixel units 311, wherein the fourth pixel unit is the pixel unit 311 other than the x+1 pixel units 311 in the n pixel units 311.

In a typical application scenario, referring to FIG. 14, based on a reference parallel to the scanning line, respective pixel switches 313 of the pixel units 311 on the edges parallel to each other and in the same column are connected with the same control line (marked with i to n in the figure) in an interlacing manner, and respective pixel switches 313 of two adjacent pixel units 311 in the same row are connected with different control lines.

For example, both the pixel switch 313 on the BC segment of the pixel module 310-1 and the pixel switch 313 on the BC segment of the pixel module 310-4 are connected with a control line k.

For example, both the pixel switch 313 on the BC segment of the pixel module 310-2 and the pixel switch 313 on the BC segment of the pixel module 310-3 are connected with a control line l.

Further, based on a reference parallel to the data lines, respective pixel switches 313 of the plurality of pixel units 311 on the edges parallel to each other and in the same row are connected with the same control line, and respective pixel switches 313 of two adjacent pixel switches 311 in the same column are connected with different control lines.

For example, the pixel switch 313 on the CD segment of the pixel module 310-1, the pixel switch 313 on the AB segment of the pixel module 310-1, and the pixel switch 313 on the CD segment of the pixel module 310-2 are all connected with the control line i.

For example, the pixel switch 313 on the CD segment of the pixel module 310-4, the pixel switch 313 on the AB segment of the pixel module 310-4, and the pixel switch 313 on the CD segment of the pixel module 310-3 are all connected with a control line j.

Further, respective signal readout terminals 320 of the four serial connection points of the same pixel module 310 are respectively connected with different data lines (marked with x, y, z and z' in the figure).

Further, some serial connection points of the plurality of pixel modules 310 may be connected with the same data line.

Further, the number of the data lines corresponds to the number of the serial connection points included in a single pixel module 310.

For example, all serial connection points C in the pixel modules 310-1 to 310-4 can be connected with a data line x, all serial connection points D in the pixel modules 310-1 to 310-4 can be connected with a data line y, all serial connection points A in the pixel module 310-1 to 310-4 can be connected with a data line z', and all serial connection points B in the pixel modules 310-1 to 310-4 can be connected with a data line z.

In this scenario, in combination with FIG. 15, the complete scanning process of the four pixel modules 310 shown in FIG. 14 may include two phases, which are respectively recorded as phase 1, suitable for reading respective differential mode signals of the serial connection points B and C, and phase 2, suitable for reading respective differential mode signals of the serial connection points A and D.

For each phase, the phase may include four sub-phases (marked with p1 to p4 in the figure).

Taking phase 1 for example, in combination with FIG. 16, in the sub-phase p1 of phase 1, the control lines i and k are applied with a high potential, and the remaining control lines are at a low potential. With the cooperation of the scanning lines 1 to 3 and the power lines u to w, the serial connection point A is applied with a voltage of 7.5V, the serial connection point B is applied with a voltage of 5V, the serial connection point C is applied with a voltage of 2.5V, and the serial connection point D is applied with a voltage of 0V.

At this time, the AB segment, the BC segment and the CD segment of the pixel module 310-1 are switched on, and the current flows in a sequence from the serial connection point A to the serial connection point B to the serial connection point C to the serial connection point D of the pixel module 310-1. At this time, the differential mode signals of the pixel unit 311 on the AB segment and the pixel unit 311 on the BC segment of the pixel module 310-1 at the serial connection point B may be read through the data line z, and the differential mode signals of the pixel unit 311 on the BC segment and the pixel unit 311 on the CD segment of the pixel module 310-1 at the serial connection point C may be read through the data line x.

Further, in the sub-phase p1, the common mode signals of the pixel unit 311 on the AB segment and the pixel unit 311 on the BC segment of the pixel module 310-1 at the serial connection point A may also be read through the data line z'.

Further, in the sub-phase p1, the common mode signals of the pixel unit 311 on the BC segment and the pixel unit 311 on the CD segment of the pixel module 310-1 at the serial connection point D may also be read through the data line y.

Further, in each sub-phase, two adjacent scanning lines can be switched on at the same time, and then the next set of two adjacent scanning lines can be switched on at the same time, and so on.

For example, in the sub-phase p1, the scanning line 1 and the scanning line 2 are first switched on to simultaneously read the signals of the four serial connection points of the pixel module 310-1, wherein the differential mode signals are read at the serial connection points B and C, and the common mode signals are read at the serial connection points A and D.

Then, at the same time, the scanning line 3 and the most recent scanning line below the scanning line 3 are switched on to read the signal of each serial connection point of the pixel modules 310 in the next row and in the same column of the pixel module 310-4.

In the sub-phase p2 of phase 1, the control lines a and f are applied with a high potential, and the remaining control lines are at a low potential. With the cooperation with the power lines u to w and the scanning lines 1 to 3, the AB segment, the BC segment and the CD segment of the pixel module 310-2 are switched on, and the current flows in a sequence from the serial connection point A to the serial connection point B to the serial connection point C to the serial connection point D of the pixel module 310-2. At this time, the differential mode signals of the pixel unit 311 on the AB segment and the pixel unit 311 on the BC segment of the pixel module 310-2 at the serial connection point B may be read through the data line z, and the differential mode signals of the pixel unit 311 on the BC segment and the pixel unit 311 on the CD segment of the pixel module 310-2 at the serial connection point C may be read through the data line z.

Further, in the sub-phase p2, the common mode signals of the pixel unit 311 on the AB segment and the pixel unit 311 on the BC segment of the pixel module 310-2 at the serial connection point A may also be read through the data line z'.

Further, in the sub-phase p2, the common mode signals of the pixel unit 311 on the BC segment and the pixel unit 311 on the CD segment of the pixel module 310-2 at the serial connection point D may also be read through the data line y.

In the sub-phase p3 of phase 1, the control lines b and f are applied with a high potential, and the remaining control lines are at a low potential. With the cooperation of the power lines u to w and the scanning lines 1 to 3, the AB segment, the BC segment and the CD segment of the pixel module 310-3 are switched on, and the current flows in a sequence from the serial connection point A to the serial connection point B to the serial connection point C to the serial connection point D of the pixel module 310-3. At this time, the differential mode signals of the pixel unit 311 on the AB segment and the pixel unit 311 on the BC segment of the pixel module 310-3 at the serial connection point B may be read through the data line z, and the differential mode signals of the pixel unit 311 on the BC segment and the pixel unit 311 on the CD segment of the pixel module 310-3 at the serial connection point C may be read through the data line z.

Further, in the sub-phase p3, the common mode signals of the pixel unit 311 on the AB segment and the pixel unit 311 on the BC segment of the pixel module 310-3 at the serial connection point A may also be read through the data line z'.

Further, in the sub-phase p3, the common mode signals of the pixel unit 311 on the BC segment and the pixel unit 311 on the CD segment of the pixel module 310-3 at the serial connection point D may also be read through the data line y.

In the sub-phase P4 of phase 1, the control lines b and e are applied with a high potential, and the remaining control lines are at a low potential. With the cooperation of the power lines u to w and the scanning lines 1 to 3, the AB segment, the BC segment and the CD segment of the pixel module 310-4 are switched on, and the current flows in a sequence from the serial connection point A to the serial connection point B to the serial connection point C to the serial connection point D of the pixel module 310-4. At this time, the differential mode signals of the pixel unit 311 on the AB segment and the pixel unit 311 on the BC segment of the pixel module 310-4 at the serial connection point B may be read through the data line z, and the differential mode signals of the pixel unit 311 on the BC segment and the pixel unit 311 on the CD segment of the pixel module 310-4 at the serial connection point C may be read through the data line x.

Further, in the sub-phase p4, the common mode signals of the pixel unit 311 on the AB segment and the pixel unit 311 on the BC segment of the pixel module 310-4 at the serial connection point A may also be read through the data line z'.

Further, in the sub-phase p4, the common mode signals of the pixel unit 311 on the BC segment and the pixel unit 311 on the CD segment of the pixel module 310-4 at the serial connection point D may also be read through the data line y.

Therefore, with the solution of the embodiment, the signals of the four serial connection points of the same pixel module 310 can be read at the same time without mutual influence, which is conducive to improving the overall signal acquisition efficiency of the image sensor 300.

Figure 17:
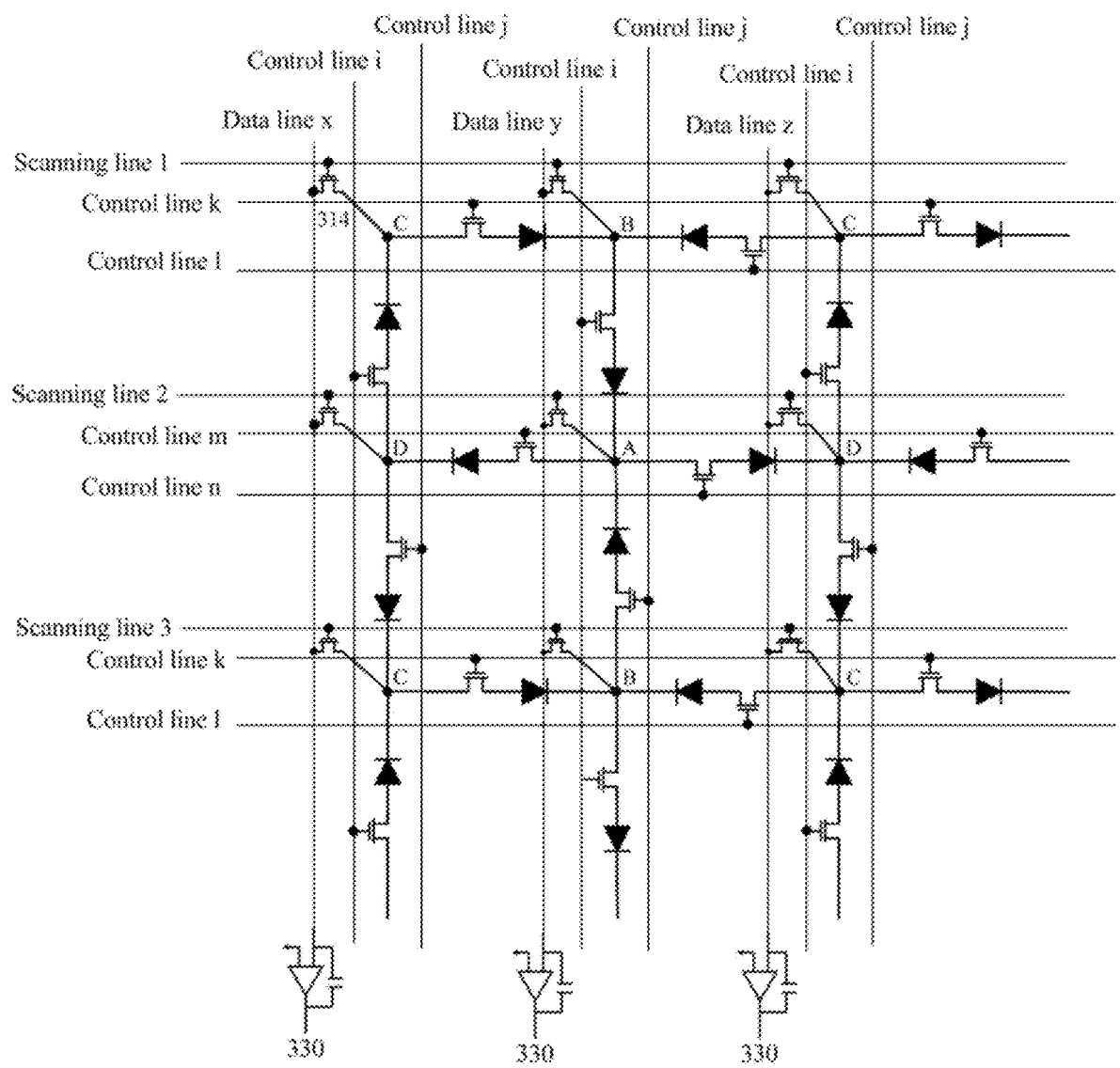
FIG. 17 is a schematic diagram of a circuit connection of an image sensor according to a fourth embodiment of the present disclosure.

FIG. 17 is a schematic diagram of a circuit connection of an image sensor according to a fourth embodiment of the present disclosure.

Next, only the differences between the fourth embodiment and the third embodiment shown in FIGS. 14 to 16 above will be described in detail.

In some embodiment, the serial connection points of the pixel units 311 in the same column can share the same data line (marked with x to z in the figure).

For example, the serial connection points C and D of the pixel module 310-1 and the serial connection point C of the pixel module 310-4 are commonly connected with a data line x, the serial connection points A and B of the pixel module 310-1 and the serial connection point B of the pixel module 310-4 are commonly connected with a data line y, and the serial connection points C and D of the pixel module 310-2 and the serial connection point C of the pixel module 310-3 are commonly connected with a data line z.

In some embodiment, a timing diagram of the pixel switch control unit in a single complete scanning process can follow that of the third embodiment shown in FIG. 15, and the power line connection diagram of the multiple pixel modules 310 can follow that of the third embodiment shown in FIG. 16.

The difference between the present embodiment and the third embodiment is that in each sub-phase, all scanning lines are switched on one by one. When all scanning lines are switched for one time, the next sub-phase is started for repetition.

For example, in the sub-phase p1, the current flows successively through the serial connection points A to B to C to D of the pixel module 310-1. At this time, the serial connection points B and C are suitable for reading the differential mode signals and the serial connection points A and D are suitable for reading the common mode signals.

In order to successfully read the signal of each serial connection point, in some embodiment, the scanning line 1 is first switched on to read the differential mode signal of the serial connection point C through the data line x, and read the differential mode signal of the serial connection point B through the data line y.

Then, the scanning line 2 is switched on to read the common mode signal of the serial connection point D through the data line x in a time dividing manner and read the common mode signal of the serial connection point A through the data line y in a time dividing manner.

In this way, the signal of each serial connection point can be read in a time dividing manner by sharing the data lines, and the effect of simplifying the wiring can be achieved.

In a common embodiment of the third embodiment and the fourth embodiment, the power line u to w can be in an on state at most of the time to apply an appropriate voltage to the connected serial connection point. For each power line, when the signals are read in the column in which the pixel unit 311 connected with the power line is located, the power line is switched off. That is, the on/off timing of the power line and the scanning line connected with the same pixel unit 311 is mutually exclusive.

Another embodiment of the present disclosure also provides a storage medium having computer instructions stored thereon, and the computer instructions are executed to perform steps of the signal acquisition method shown in FIG. 6.

Further, another embodiment of the present disclosure also discloses a terminal. The terminal includes a memory having computer instructions stored thereon and a processor, and the computer instructions are executed by the processor to perform steps of the signal acquisition method shown in FIG. 6. In some embodiment, the terminal may be a computing device, such as a mobile phone, a computer, etc.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. An image sensor, comprising a plurality of pixel modules, each pixel module comprising:
   n pixel units connected in series to form a closed-loop structure, wherein n≥3, each pixel unit has a first terminal and a second terminal, and each pixel unit comprises a photosensitive element and a pixel switch connected in series; and
   n signal readout terminals, wherein each serial connection point between one pixel unit and the other pixel unit is connected with a corresponding signal readout terminal;
   wherein two adjacent pixel modules share a same pixel unit and signal readout terminals connected with the first terminal and the second terminal of the same pixel unit.

2. The image sensor according to claim 1, further comprising:
   a plurality of control lines, connected with control terminals of different pixel switches in a same pixel module respectively;
   a plurality of data lines, connected with signal readout terminals correspondingly; and
   a plurality of scanning lines, connected with photosensitive elements correspondingly.

3. The image sensor according to claim 2, wherein some of the pixel modules share a scanning line, some of the pixel modules share a data line, and some of the pixel modules share a control line.

4. The image sensor according to claim 1, wherein the plurality of pixel modules are formed on a glass substrate.

5. A signal acquisition method of an image sensor, the image sensor comprising a plurality of pixel modules, wherein each pixel module comprises:
   n pixel units connected in series to form a closed-loop structure, wherein n≥3, each pixel unit has a first terminal and a second terminal, and each pixel unit comprises a photosensitive element and a pixel switch connected in series; and
   n signal readout terminals, wherein each serial connection point between one pixel unit and the other pixel units is connected with a corresponding signal readout terminal;
   wherein two adjacent pixel modules share a same pixel unit and signal readout terminals connected with the first terminal and the second terminal of the same pixel unit;
the signal acquisition method comprising:
performing signal acquisition on the n signal readout terminals successively for each pixel module in a single signal acquisition period, wherein the signal acquisition period comprises n sub-periods, and each sub-period corresponds to at least one signal readout terminal;
controlling respective pixel switches of a first pixel unit and a second pixel unit to be switched on, controlling a current to flow through the first pixel unit and the second pixel unit, and collecting a first electrical signal of an i-th signal readout terminal in an i-th sub-period, wherein the first pixel unit and the second pixel unit are two pixel units connected with the i-th signal readout terminal in the n signal readout terminals, and 1≤i≤n.

6. The signal acquisition method according to claim 5, wherein the first electrical signal is a differential mode signal of the first pixel unit and the second pixel unit.

7. The signal acquisition method according to claim 5, further comprising:
   collecting a second electrical signal of a signal readout terminal connected with a serial connection point between the first pixel unit and a third pixel unit in the i-th sub-period, wherein the third pixel unit is a pixel unit other than the second pixel unit in the n pixel units; and/or
   collecting a second electrical signal of a signal readout terminal connected with a serial connection point between the second pixel unit and a fourth pixel unit, wherein the fourth pixel unit is a pixel unit other than the second pixel unit in the n pixel units.

8. The signal acquisition method according to claim 7, wherein the second electrical signal is a common mode signal of the first pixel unit and the second pixel unit.

9. The signal acquisition method according to claim 5, wherein when each sub-period corresponds to x signal readout terminals, and 2≤x<n,
   controlling respective pixel switches of x+1 pixel units connected in series in the n pixel units to be switched on, controlling a current to flow through the x+1 pixel units, and collecting a first electrical signal of the x signal readout terminals respectively in the i-th sub-period, wherein the serial connection points between two pixel units in the x+1 pixel units are respectively connected with the x signal readout terminals.

10. The signal acquisition method according to claim 9, further comprising:
    collecting a second electrical signal of a signal readout terminal connected with a serial connection point between a first pixel unit and a third pixel unit within the x+1 pixel units in the i-th sub-period, wherein the third pixel unit is a pixel unit other than the x+1 pixel units in the n pixel units; and/or
    collecting a second electrical signal of a signal readout terminal connected with a serial connection point between a last pixel unit and a fourth pixel unit within the x+1 pixel units, wherein the fourth pixel unit is a pixel unit other than the x+1 pixel units within the n pixel units.

11. A storage medium having computer instructions stored thereon, wherein the computer instructions are executed to perform steps of the signal acquisition method according to claim 5.

12. A terminal comprising a memory having computer instructions stored thereon and a processor, wherein the computer instructions are executed by the processor to perform steps of the signal acquisition method according to claim 5.

13. A signal acquisition circuit of an image sensor, the image sensor comprising a plurality of pixel modules, wherein each pixel module comprises:
    n pixel units connected in series to form a closed-loop structure, wherein n≥3, each pixel unit has a first terminal and a second terminal, and each pixel unit comprises a photosensitive element and a pixel switch connected in series; and n signal readout terminals, wherein each serial connection points between one pixel unit and the other pixel unit is connected with a corresponding signal readout terminal;

wherein two adjacent pixel modules share a same pixel unit and signal readout terminals connected with the first terminal and the second terminal of the same pixel unit;

wherein for each pixel module, signal acquisition is performed on the n signal readout terminals successively by the signal acquisition circuit in a single signal acquisition period, the signal acquisition period comprises n sub-periods, and each sub-period corresponds to at least one signal readout terminal;

the signal acquisition circuit comprising:

a pixel switch control unit for controlling respective pixel switches of a first pixel unit and a second pixel unit to be switched on in an i-th sub-period, wherein the first pixel unit and the second pixel unit are two pixel units connected with an i-th signal readout terminal within the n signal readout terminals, and 1≤i≤n;

a scanning line control unit for controlling a current to flow through the first pixel unit and the second pixel unit in the i-th sub-period; and a signal readout unit for collecting a first electrical signal of the i-th signal readout terminal in the i-th sub-period.

14. The signal acquisition circuit according to claim 13, wherein the pixel switch control unit is coupled with a plurality of control lines, and control terminals of different pixel switches in a same pixel module are connected with different control lines;

the signal readout unit is coupled with a plurality of data lines, and each signal readout terminal is connected with a corresponding data line; and the scanning line control unit is coupled with a plurality of scanning lines, and each photosensitive element is connected with a corresponding scanning line.

15. The signal acquisition circuit according to claim 13, wherein the first electrical signal is a differential mode signal of the first pixel unit and the second pixel unit.

16. The signal acquisition circuit according to claim 13, wherein a second electrical signal of a signal readout terminal connected with a serial connection point between the first pixel unit and a third pixel unit is collected by the signal readout unit in the i-th sub-period, and the third pixel unit is a pixel unit other than the second pixel unit in the n pixel units; and/or a second electrical signal of a signal readout terminal connected with a serial connection point between the second pixel unit and a fourth pixel unit is collected by the signal readout unit, and the fourth pixel unit is a pixel unit other than the second pixel unit in the n pixel units.

17. The signal acquisition circuit according to claim 16, wherein the second electrical signal is a common mode signal of the first pixel unit and the second pixel unit.

18. The signal acquisition circuit according to claim 13, wherein when each sub-period corresponds to x signal readout terminals, and 2≤x<n, respective pixel switches of x+1 pixel units connected in series in the n pixel units are controlled by the pixel switch control unit to be switched on in the i-th sub-period;

a current is controlled by the scanning line control unit to flow through the x+1 pixel units; and first electrical signals of the x signal readout terminals are collected by the signal readout unit, and the serial connection points between two pixel units in the x+1 pixel units are respectively connected with the x signal readout terminal.

19. The signal acquisition circuit according to claim 18, wherein a second electrical signal of a signal readout terminal connected with a serial connection point between a first pixel unit and a third pixel unit in the x+1 pixel units is collected by the signal readout unit in the i-th sub-period, and the third pixel unit is a pixel unit other than the x+1 pixel units in the n pixel units; and/or a second electrical signal of a signal readout terminal connected with a serial connection point between a last pixel unit and a fourth pixel unit in the x+1 pixel units is collected by the signal readout unit, and the fourth pixel unit is a pixel unit other than the x+1 pixel units in the n pixel units.

* * * * *